United States Patent
Shinohara et al.

(10) Patent No.: US 9,379,597 B2
(45) Date of Patent: Jun. 28, 2016

(54) SYSTEM FOR DRIVING ELECTROMAGNETIC APPLIANCE AND MOTOR DRIVEN VEHICLE

(71) Applicant: KABUSHIKI KAISHA TOSHIBA, Minato-ku (JP)

(72) Inventors: Naoto Shinohara, Yokohama (JP); Kazunobu Nagai, Yokohama (JP); Kazuhisa Matsuge, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 201 days.

(21) Appl. No.: 14/027,619

(22) Filed: Sep. 16, 2013

(65) Prior Publication Data

US 2014/0077735 A1 Mar. 20, 2014

(30) Foreign Application Priority Data

Sep. 19, 2012 (JP) .................................. 2012-205631
Feb. 14, 2013 (JP) .................................. 2013-026544

(51) Int. Cl.
*H02P 6/00* (2006.01)
*H02P 25/22* (2006.01)
(Continued)

(52) U.S. Cl.
CPC .............. *H02K 11/001* (2013.01); *B60L 3/003* (2013.01); *B60L 11/14* (2013.01); *B60L 11/1803* (2013.01);
(Continued)

(58) Field of Classification Search
CPC ........ H02K 11/00; H02K 11/001; H02P 6/00; H02P 25/22

USPC .............. 318/400.21, 400.01, 700; 310/68 D, 310/68 R, 66, 40 R, 10
See application file for complete search history.

(56) References Cited

U.S. PATENT DOCUMENTS 5,355,298 A * 10/1994 Seki ......................... G05F 1/573
363/136
5,574,636 A * 11/1996 Lee ..................... H02M 5/4585
363/132

(Continued)

FOREIGN PATENT DOCUMENTS

CN            102545671 A     7/2012
EP               1052769 A2   11/2000

(Continued)

OTHER PUBLICATIONS

Combined Office Action and Search Report issued Sep. 14, 2015 in Chinese Patent Application No. 201310403663.3 (with English translation).

(Continued)

*Primary Examiner* — Kawing Chan
(74) *Attorney, Agent, or Firm* — Oblon, McClelland, Maier & Neustadt, L.L.P.

(57) ABSTRACT

In one embodiment, system for driving an electromagnetic appliance includes an electromagnetic appliance, a main-drive unit and a sub-drive unit. The electromagnetic appliance includes coils for n number of phases, the coils for each of the n phases being arranged in a pair and wound so as to be excited in a predetermined direction by being energized with opposite-phase currents. The main drive unit is connected to each of the coils and energizes the paired coils with opposite-phase currents. The sub-drive unit is provided parallel with the main-drive unit and is configured to suppress a short-circuit current occurring at the main-drive unit when switching energization of the coils.

12 Claims, 16 Drawing Sheets

(51) Int. Cl.
- *H02K 11/00* (2016.01)
- *B60L 3/00* (2006.01)
- *B60L 11/14* (2006.01)
- *B60L 11/18* (2006.01)
- *H02M 7/5387* (2007.01)
- *H02M 7/493* (2007.01)

(52) U.S. Cl.
CPC ............... *H02K 11/20* (2016.01); *H02P 6/001* (2013.01); *H02P 25/22* (2013.01); *B60L 2200/26* (2013.01); *B60L 2210/30* (2013.01); *B60L 2210/40* (2013.01); *B60L 2220/58* (2013.01); *B60L 2270/147* (2013.01); *H02M 7/493* (2013.01); *H02M 7/5387* (2013.01); *Y02T 10/641* (2013.01); *Y02T 10/642* (2013.01); *Y02T 10/70* (2013.01); *Y02T 10/7005* (2013.01); *Y02T 10/7077* (2013.01); *Y02T 10/7241* (2013.01)

(56) References Cited

U.S. PATENT DOCUMENTS

| | | | | |
|---|---|---|---|---|
| 6,236,583 | B1* | 5/2001 | Kikuchi | H02P 27/06 318/801 |
| 9,048,764 | B2* | 6/2015 | Wagoner | H02P 9/007 |
| 2009/0116268 | A1* | 5/2009 | Kishida | H02M 1/12 363/68 |
| 2009/0206662 | A1* | 8/2009 | Kakuda | B60K 6/365 307/11 |
| 2010/0071970 | A1 | 3/2010 | Welchko et al. | |
| 2010/0171473 | A1* | 7/2010 | Kazama | H02M 1/34 323/271 |
| 2011/0299311 | A1* | 12/2011 | Zhu | H02M 1/126 363/132 |
| 2012/0176084 | A1* | 7/2012 | Klaes | B60L 11/1803 320/107 |
| 2013/0314965 | A1* | 11/2013 | Shinohara | H02M 7/5387 363/132 |

FOREIGN PATENT DOCUMENTS

| | | | | |
|---|---|---|---|---|
| EP | 1792770 | A2 | 6/2007 | |
| EP | 2151915 | A1 | 5/2008 | |
| JP | 2000-324891 | | 11/2000 | |
| JP | 2000-324892 | | 11/2000 | |
| JP | 2000-324892 | A | 11/2000 | |
| JP | WO 2012049706 | A1 * | 4/2012 | ............ H02M 1/12 |
| WO | WO 2009/053519 | A1 | 4/2009 | |

OTHER PUBLICATIONS

European Search Report mailed Jan. 16, 2016 in Patent Application No. 13184730.3.

Katsis D. C. et al., "Drive Cycle Evaluation of Soft-Switched Electric Vehicle Inverter," Proceedings of the IECON 1997, vol. 2, Nov. 9, 1997, pp. 658-663.

* cited by examiner ured by PWM (Pulse Width
SYSTEM FOR DRIVING ELECTROMAGNETIC APPLIANCE AND MOTOR DRIVEN VEHICLE

CROSS-REFERENCE TO RELATED APPLICATION(S)

This application is based upon and claims the benefit of priority from Japanese Patent Application No. 2012-205631, filed on, Sep. 19, 2012 and Japanese Patent Application No. 2013-026544, filed on, Feb. 14, 2013 the entire contents of which are incorporated herein by reference.

FIELD

Embodiments disclosed herein generally relate to a system for driving electromagnetic appliances and a motor driven vehicle.

BACKGROUND

A power converter for driving a three phase motor, for example, is configured by a half-bridge circuit provided for each of the three phases connected in parallel between positive and negative DC (Direct Current) source lines. The half-bridge circuit comprises a pair of semiconductor switches series connected between DC power source lines and a free-wheeling diode in an inverse-parallel connection with each of the semiconductor switches. In such power converter, the semiconductor switches are driven by PWM (Pulse Width Modulation) control and thus, DC power given by the DC power source line is converted into three-phase AC power to energize the motor windings with a sinusoidal current.

Under such configuration, improvement in controllability, reduction of audible energizing sound originating from PWM modulation, and downsizing of peripheral components is being sought through increased PWM frequency.

In PWM control, shorting between DC power source lines are prevented through the half-bridge circuit by providing a so-called dead time during which the pair of semiconductor switches are both turned OFF. Increasing the PWM frequency increases the duration simultaneous OFF period within a PWM period. Thus, sufficient ON time needs to be obtained by reducing or accelerating the turn-on time (rise time) of the semiconductor switches.

Given such circumstances, a motor drive system employing the power converter configured as described above is facing increase in common-mode current flowing into the earth due to noise originating from sudden voltage variation at the coil neutral point. Floating capacitance, which is a parasitic capacitive component, is found on various parts of the motor such as the coil, stator, rotor, housing, and the rotary shaft. When the motor is used in in-vehicle system applications such as in electric vehicles or the like, the floating capacitance becomes capacitively coupled to the metal chassis. As a result, common-mode current flows throughout the chassis by way of the capacitively coupled component to increase the common-mode noise.

A typical approach for suppressing common-mode noise is providing dedicated additional circuitry such as a common-mode transformer and a common-mode-current prevention circuit which tend to be sizable. Such approach increases the complexity of the circuit as well as the overall size and manufacturing cost. Various other approaches for reducing the common-mode noise have been conceived other than those described above. However, neither of such approaches provides an easy solution for common-mode noise originating from high-frequency variation of surge voltage produced by shorting-circuit current flowing between the DC power source lines at the end of dead time. The short-circuit current is caused by the reverse current flow (recovery current) produced by the transport of remaining carrier when the free-wheeling diode goes through reverse recovery after free-wheeling current flows the freewheeling diode during dead time.

DESCRIPTION

A system for driving electromagnetic appliance with improved common-mode noise suppression feature and a motor driven vehicle employing such appliance is disclosed herein.

In one embodiment, the system for driving electromagnetic appliance includes an electromagnetic appliance including coils for n number of phases where n is a positive integer equal to or greater than 2, the coils for each of the n phases being arranged in a pair and wound so as to be excited in a predetermined direction by being energized with opposite-phase currents; a main drive unit connected to each of the coils and energizing the paired coils with opposite-phase currents; and a sub-drive unit being provided parallel with the main-drive unit and being configured to suppress a short-circuit current occurring at the main-drive unit when switching energization of the coils.

First Embodiment

Figure 1:
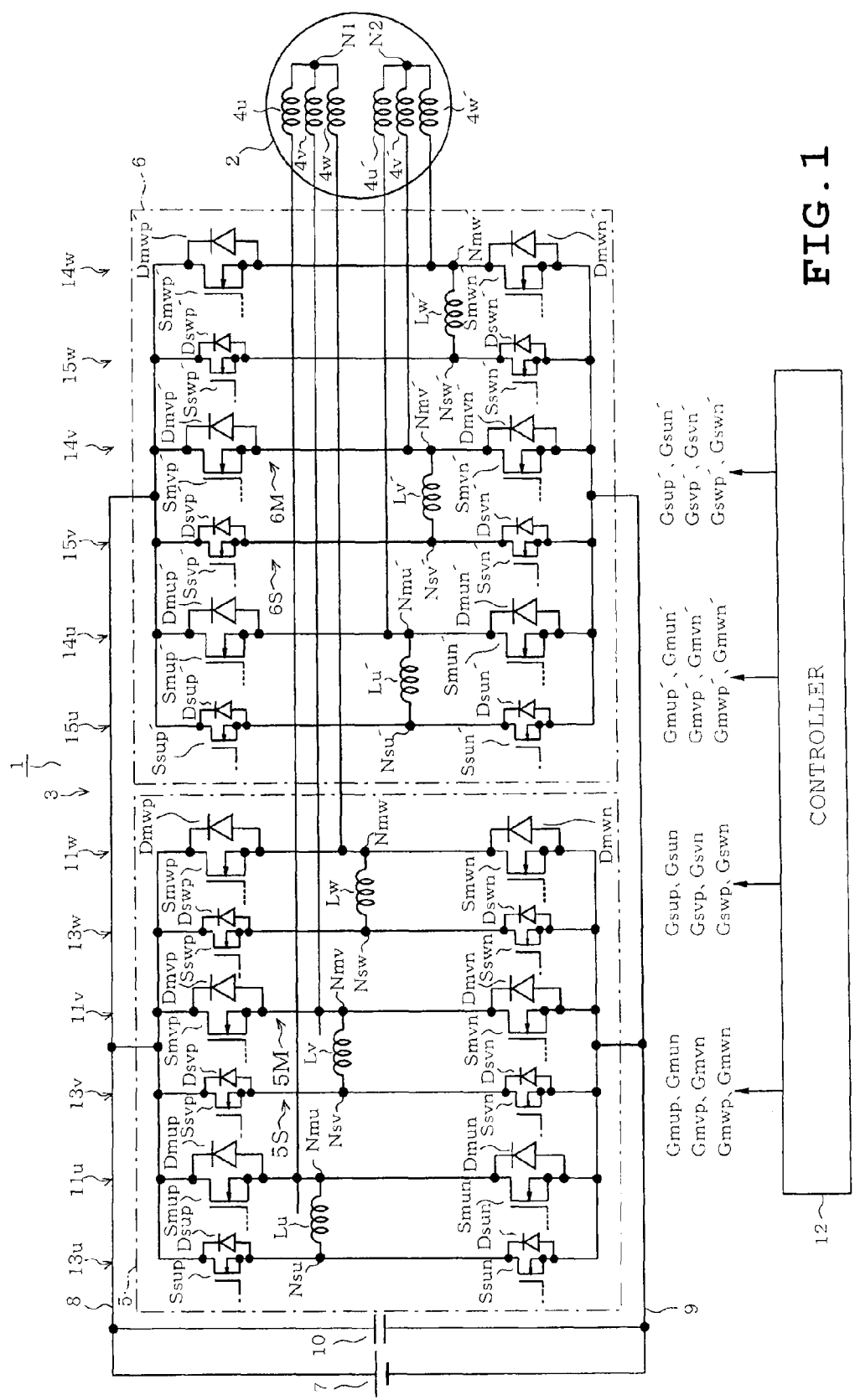
FIG. 1 pertains to a first embodiment and schematically illustrates the configuration of a motor drive system.

A first embodiment of a system for driving an electromagnetic appliance will be described through an example of a motor drive system with reference to FIGS. 1 to 13. Motor drive system 1 illustrated in FIG. 1 is provided with drive unit 3 and motor 2 driven by drive unit 3. Motor 2 comprises a three-phase brushless DC motor and is provided with a pair of three phase (n=3) stator coils namely first coils 4u, 4V, and 4w and second coils 4u', 4V', and 4w'. As later described in detail, motor 2 is wound so that the rotor rotates in a predetermined direction when first coils 4u, 4V, and 4w and second coils 4u', 4V', and 4w' are energized with mutually opposite three-phase currents. Motor 2 being configured as described above will also be referred to as "three-phase motor".

Drive unit 3 is provided with first power converter 5 and second power converter 6 in a parallel arrangement. Both first power converter 5 and second power converter 6 comprise a DC-AC inverter which converts DC power (DC voltage) given by DC power source 7 through a pair of DC power source lines 8 and 9 into a three-phase AC power (AC voltage). DC power source 7 comprises, for example, a lithium ion battery but may be replaced by a DC-DC converter, AC-AC converter that converts AC power given by AC power source into DC power. Smoothing condenser 10 is connected between DC power source lines 8 and 9 and smoothens the voltage variations encountered between DC power source lines 8 and 9 due to the switching operation performed at first and second converters 5 and 6.

First power converter 5 is provided with six switching elements Smup, Smun, Smvp, Smvn, Smwp, and Smwn; six main-freewheeling diodes Dmup, Dmun, Dmvp, Dmvn, Dmwp, and Dmwn; six sub switching elements Ssup, Ssun, Ssvp, Ssvn, Sswp, and Sswn; six sub-freewheeling diodes Dsup, Dsun, Dsvp, Dsvn, Dswp, and Dswn; and three sub-inductors Lu, Lv, and Lw.

First main-drive unit 5M comprises main-switching elements Smup to Smwn and main-freewheeling diodes Dmup to Dmwn.

First sub-drive unit 5S comprises sub-switching elements Ssup to Sswn; sub-freewheeling diodes Dsup to Dswn; and sub-inductors Lu to Lw.

Main switching elements Smup to Smwn may comprise an N-channel power MOSFET. Main freewheeling diodes Dmup to Dmwn are respectively in inverse-parallel connection with main switching elements Smup to Smwn. Main freewheeling diodes Dmup to Dmwn may comprise a parasitic diode (body diode) of a power MOSFET. However, because the duration of the reverse recovery of parasitic diode is generally long, providing another diode with good recovery features is preferable.

U-phase main half-bridge circuit 11u is configured by main-switching elements Smup and Smun and main-freewheeling diodes Dmup and Dmun series connected between DC power source lines 8 and 9. Similarly, V-phase main half-bridge circuit 11v is configured by main-switching elements Smvp and Smvn and main-freewheeling diodes Dmvp and Dmvn, and W-phase main half-bridge circuit 11w is configured by main-switching elements Smwp and Smwn and main-freewheeling diodes Dmwp and Dmwn. Each of the gates of main-switching elements Smup to Smwn are given drive signals Gmup, Gmun, Gmvp, Gmvn, Gmwp, and Gmwn outputted from controller 12.

Sub-switching elements Ssup to Sswn may comprise an N-channel power MOSFET. Sub-freewheeling diodes Dsup to Dswn are respectively in inverse-parallel connection with sub-switching elements Ssup to Sswn. Sub-freewheeling diodes Dsup to Dswn may comprise a power MOSFET parasitic diode or an additional diode. Compared to main-switching elements Smup to Smwn, sub-switching elements Ssup to Sswn are smaller in size (have greater ON resistance) and smaller in rated drain current. Compared to main-freewheeling diodes Dmup to Dmwn, sub-freewheeling diodes Dsup to Dswn are smaller in size and smaller in rated forward current.

U-phase sub-half bridge circuit 13u is configured by sub-switching elements Ssup and Ssun and sub-freewheeling diodes Dsup and Dsun series connected between DC power source lines 8 and 9. Similarly, V-phase sub-half bridge circuit 13v is configured by sub-switching elements Ssvp and Ssvn and sub-freewheeling diodes Dsvp and Dsvn, and W-phase sub-half bridge circuit 13w is configured by sub-switching elements Sswp and Sswn and sub-freewheeling diodes Dswp and Dswn. Each of the gates of sub-switching elements Ssup to Sswn are given drive signals Gsup, Gsun, Gsvp, Gsvn, Gswp, and Gswn outputted from controller 12.

Sub-inductor Lu is connected between midpoint Nmu (mutual connection point of main-switching elements Smup and Smun) of main-half bridge circuit 11u and midpoint Nsu (mutual connection point of main-switching elements Ssup and Ssun) of sub-half bridge circuit 13u. Sub-inductor Lv is connected between midpoint Nmv of main-half bridge circuit 11v and midpoint Nsv of sub-half bridge circuit 13v. Sub-inductor Lw is connected between midpoint Nmw of main-half bridge circuit 11w and midpoint Nsw of sub-half bridge circuit 13w.

In the above described configuration, main-half-bridge circuit 11u and sub-half bridge circuit 13u; main-half-bridge circuit 11v and sub-half bridge circuit 13v; main-half-bridge circuit 11w and sub-half bridge circuit 13w; are grouped, respectively.

Each of midpoints Nmu, Nmv, and Nmw of main-half bridge circuits 11u, 11v, and 11w is an output terminal of first power converter 5. Midpoint Nmu is connected to one of the terminals of first coil 4u of motor 2 via an electric wire. Midpoint Nmv is connected to one of the terminals of first coil 4v of motor 2 via an electric wire. Midpoint Nmw is connected to one of the terminals of first coil 4w of motor 2 via an electric wire. The remaining other terminal of each of the three-phase first coils 4u to 4w establish a common connection. The three-phase first coils 4u to 4w establish a star connection at neutral point N1 of the common connection. The three-phase first coils 4u to 4w may alternatively establish other connections such as a delta connection.

Second power converter 6 is similar in structure to first power converter and is provided with six switching elements Smup', Smun', Smvp', Smvn', Smwp', and Smwn'; six main-freewheeling diodes Dmup', Dmun', Dmvp', Dmvn', Dmwp', and Dmwn'; six sub switching elements Ssup', Ssun', Ssvp', Ssvn', Sswp', and Sswn'; six sub-freewheeling diodes Dsup', Dsun', Dsvp', Dsvn', Dswp', and Dswn'; and three sub-inductors Lu', Lv', and Lw'.

A second main-drive unit comprises main-switching elements Smup' to Smwn' and main-freewheeling diodes Dmup' to Dmwn'.

A second sub-drive unit comprises sub-switching elements Ssup' to Sswn', sub-freewheeling diodes Dsup' to Dswn', and sub-inductors Lu' to Lw'.

U'-phase main half-bridge circuit 14u is configured by main-switching elements Smup' and Smun' and main-freewheeling diodes Dmup' and Dmun'. V-phase main half-bridge circuit 14v is configured by main-switching elements Smvp' and Smvn' main-freewheeling diodes Dmvp' and Dmvn'. W-phase main half-bridge circuit 14w is configured by main-switching elements Smwp' and Smwn' and main-freewheeling diodes Dmwp' and Dmwn'. Each of the gates of main-switching elements Smup' to Smwn' are given drive signals Gmup', Gmun', Gmvp', Gmvn', Gmwp', and Gmwn' outputted from controller 12.

U'-phase sub-half bridge circuit 15u is configured by sub-switching elements Ssup' and Ssun' and sub-freewheeling diodes Dsup' and Dsun'. V'-phase sub-half bridge circuit 15v is configured by sub-switching elements Ssvp' and Ssvn' and sub-freewheeling diodes Dsvp' and Dsvn'. W'-phase sub-half bridge circuit 15w is configured by sub-switching elements Sswp' and Sswn' and sub-freewheeling diodes Dswp' and Dswn'. Each of the gates of sub-switching elements Ssup' to Sswn' are given drive signals Gsup', Gsun', Gsvp', Gsvn', Gswp', and Gswn' outputted from controller 12.

Sub-inductor Lu', Lv', and Lw' are connected between midpoints Nmu', Nmv', and Nmw' of main-half bridge circuits 14u, 14v, and 14w and Nsu', Nsv', and Nsw' of sub-half bridge circuits 15u, 15v, and 15w, respectively. In the above configuration, main-half bridge circuit 14u and sub-half bridge circuit 15u, main-half bridge circuit 14v and sub-half bridge circuit 15v, and main-half bridge circuit 14w and sub-half bridge circuit 15w are grouped respectively.

Each of midpoints Nmu', Nmv', and Nmw' of main-half bridge circuits 14u, 14v, and 14w is an output terminal of second power converter 6. Midpoint Nmu' is connected to one of the terminals of second coil 4u' of motor 2 via an electric wire. Midpoint Nmv' is connected to one of the terminals of second coil 4v' of motor 2 via an electric wire. Midpoint Nmw' is connected to one of the terminals of second coil 4w' of motor 2 via an electric wire. The remaining other terminal of each of the three-phase second coils 4u' to 4w' establish a common connection. The three-phase first coils 4u' to 4w' establish a star connection at neutral point N2 of the common connection. The three-phase second coils 4u' to 4w' may alternatively establish other connections such as a delta connection.

In the first embodiment, common-mode current suppression unit that suppresses common-mode noise is configured by the above described first main-drive unit 5M, second main-drive unit 6M, first coils 4u to 4w and second coils 4u' to 4w'. Further, switching short-circuit current suppression unit that suppresses radiation and common-mode noise produced by short-circuit current generated at the time of switching is configured by the above described first main-drive unit 5M and second main-drive unit 6M.

Controller 12 outputs drive signals Gmup to Gmwn and Gmup' to Gmwn' and controls the operation of first power converter 5 and second power converter 6. More specifically, controller 12 performs a PWM control of the drive (ON/OFF operation) of main-switching elements Smup to Smwn constituting main-half bridge circuit 11u to 11w in order to energize the three-phase first coils 4u to 4w with three-phase sinusoidal current. Controller 12 further performs a PWM control of the drive of main-switching elements Smup' to Smwn' constituting main-half bridge circuit 14u to 14w in order to energize the three-phase second coils 4u' to 4w' with sinusoidal current that is opposite in phase from first coils 4u to 4w.

As later described in detail, controller 12 outputs drive signals Gsup to Gswn and Gsup' to Gsswn' to drive sub-switching elements Ssup to Sswn constituting sub-half bridge circuits 13u to 13w and sub-switching elements Ssup' to Sswn' constituting sub-half bridge circuits 15u to 15w in order to suppress generation of short-circuit current during simultaneous OFF period. In the first embodiment, the time constant specified to sub-inductor Lu to Lw and Lu' to Lw' is smaller than the aforementioned PWM period.

Next, the structure of the motor of the first embodiment will be described in detail with reference to FIGS. 2 and 3.

Figure 2:
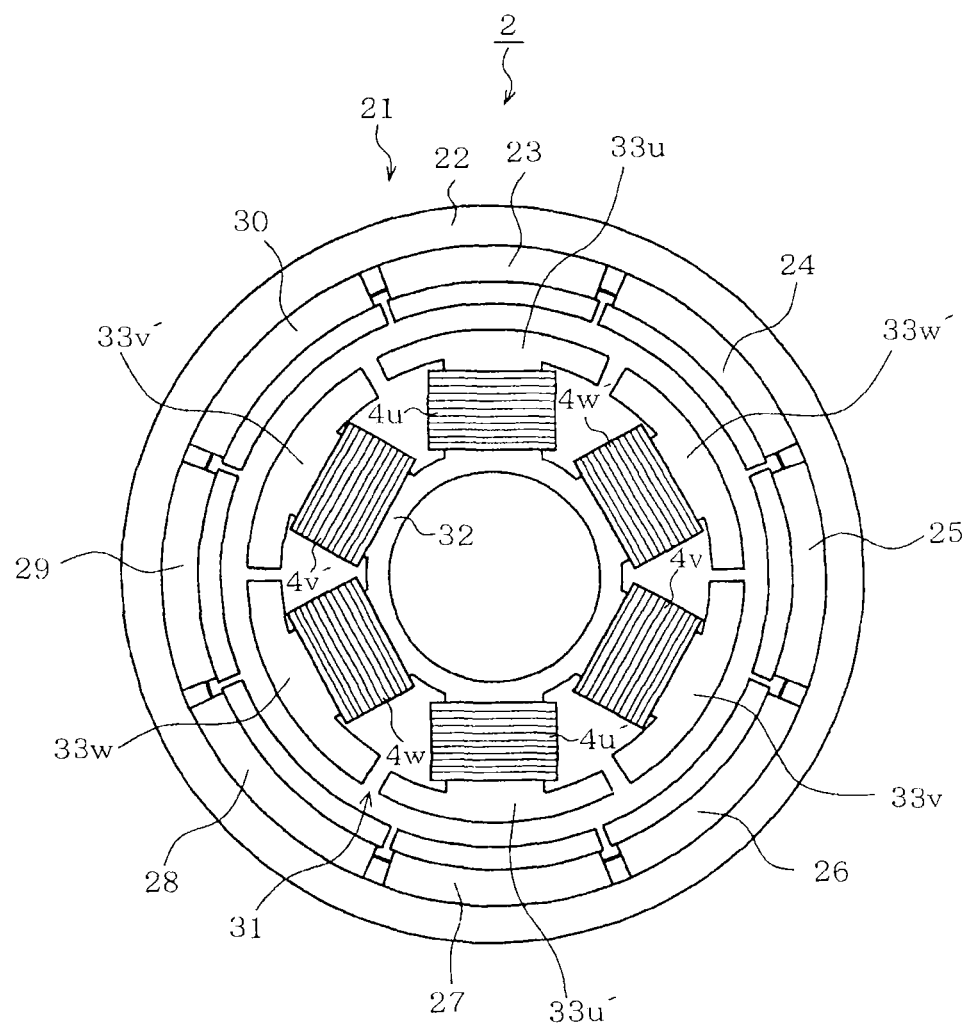
FIG. 2 is a partial cross sectional view schematically illustrating the structure of the motor.

As shown in FIG. 2, motor 2 is an outer rotor type (outer rotation type). Rotor 21 comprises rotor core 22 and permanent magnets 23 to 30. Permanent magnets 23 to 30 are each mounted on one of the eight magnet mounts formed on rotor core 22. Stator 31 of motor 2 comprises stator core 32, first coils 4u to 4w, and second coils 4u' to 4w'. Stator core 32 (corresponding to an iron core) has six teeth 33u, 33v, 33w, 33u', 33v', and 33w'. First coils 4u to 4w and second coils 4u' to 4w' are wound on teeth 33u, 33v, and 33w and teeth 33u', 33v', and 33w' respectively via an insulating element not shown.

In a conventional three-phase 6 teeth motor, the coil of each phase is wound on a couple of teeth and the terminating end of the coil of each phase is connected to a single point (neutral point). By contrast, coils are wound as follows in the first embodiment. First coils 4u to 4w being half the diameter of conventional coils are each wound on the corresponding teeth 33u to 33w. Second coils 4u' to 4w' being equal in diameter to first coils 4u to 4w are wound on the corresponding teeth 33u' to 33w' so as to be parallel to first coils 4u to 4w. The terminating ends of first coils 4u to 4w and second coils 4u' to 4w' are connected to a single point respectively and constitute neutral points N1 and N2.

More specifically, first coil 4u is wound on teeth 33u, second coil 4u' is wound on teeth 33u' opposing teeth 33u. First coil 4v is wound on teeth 33v, second coil 4v' is wound on teeth 33v' opposing teeth 33v. First coil 4w is wound on teeth 33w, second coil 4w' is wound on teeth 33w' opposing teeth 33w. The volume of stator coils of motor 2 configured as described above is substantially equal to the volume of stator coils of the conventional three-phase six teeth motor. As can be seen in FIG. 3, first coils 4u to 4w and second coils 4u' to 4w' each establish a star connection.

As described above, when motor 2 is driven, first coils 4u to 4w and second coils 4u' to 4w' are energized by three-phase sinusoidal currents being opposite in phase. This means that the phase of currents energizing first coil 4u and second coil 4u' differ from one another by 180 degrees (inversed). Similarly, the phase of currents energizing first coil 4v and second coil 4v' differ from one another by 180 degrees and the phase of currents energizing first coil 4w and second coil 4w' differ from one another by 180 degrees.

The phase of currents energizing the U-phase first coil 4u and the V-phase first coil 4v differ from one another by 120 degrees. Similarly, the phase of currents energizing the V-phase first coil 4v and the W-phase first coil 4w differ from one another by 120 degrees and the phase of currents energizing the W-phase first coil 4w and the U-phase first coil 4u differ from one another by 120 degrees. In order to energize the coils as described above, first coils 4u to 4w and second coils 4u' to 4w' are wound on stator core 32 so as to generate a magnetic field to rotate rotor 21 in the same direction (so as to excite rotor 21 in a predetermined direction).

Figure 4:
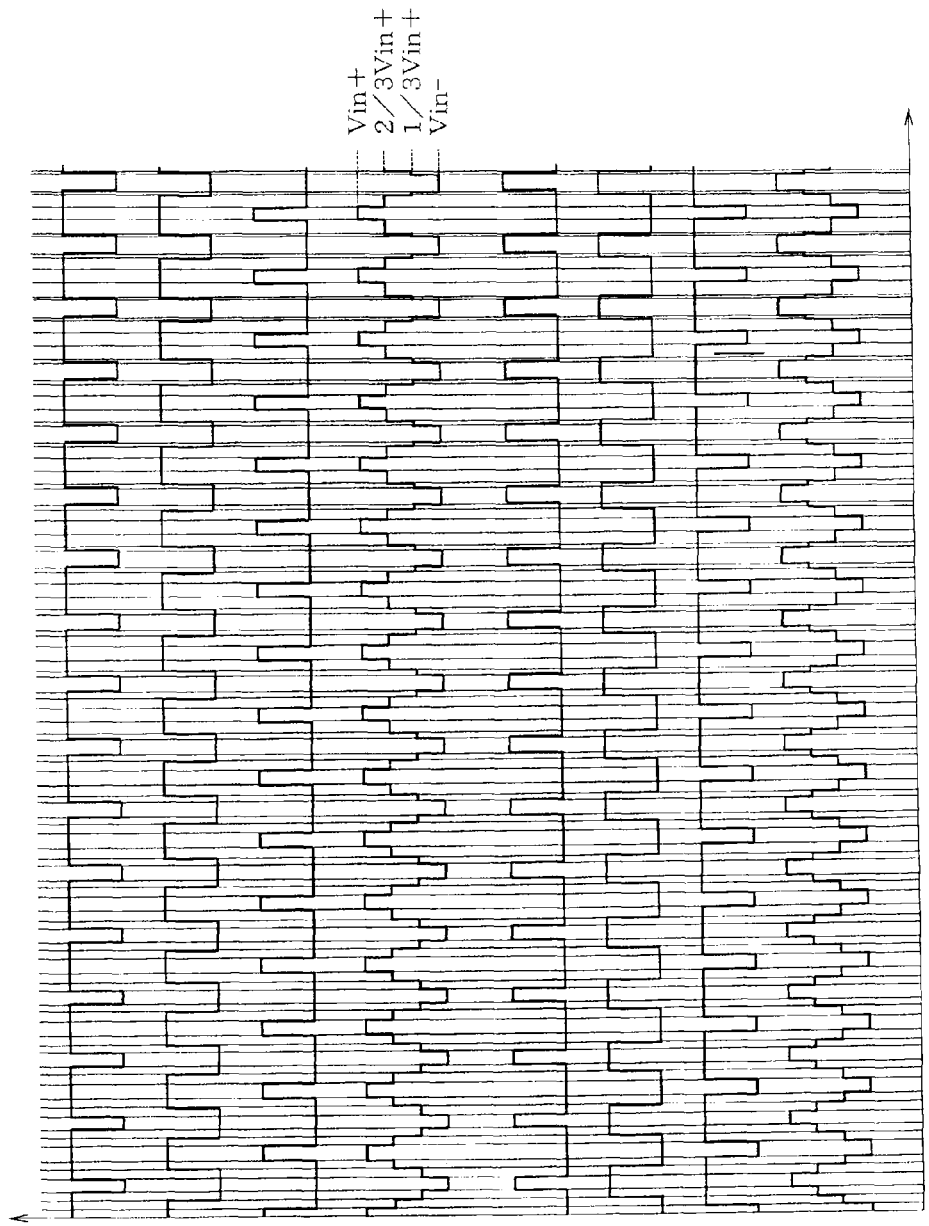
FIG. 4 is a chart indicating the terminal voltage and the neutral point voltage of the stator coils.

Under such configuration, when a terminal voltage of one end of each of first coils 4u to 4w are varied as indicated in "a" to "c" in the chart of FIG. 4, for example, the voltage of neutral point N1 of first coils 4u to 4w varies as indicated in "d" in FIG. 4. It is to be noted that the line resistance between each of the n phases are deemed to be equal. Further, the voltage levels of DC power source line 8 and DC power source line 9 which are input voltages to first power converter 5 are represented as Vin+ and Vin− respectively.

In patterns "a" to "c" indicated in FIG. 4, the U-phase duty ratio is 75%, the V-phase duty ratio is 50%, and the W-phase duty ratio is 25%. As a result, there are period (0) when voltage is not generated, period (1) when only U-phase voltage is generated, period (2) when U-phase voltage and V-phase voltage are generated, and period (3) when all of U, V, and W-phase voltages are generated. Thus, the voltage level of neutral point N1 is Vin− at period (0), ⅓ times Vin+ at period (1), ⅔ times Vin+ at period (2), and Vin+ at period (3).

As shown in "e" to "h" in FIG. 4, on the other hand, terminal voltage of one of the terminals of each of second coils 4u' to 4w' and neutral point N2 are opposite in phase with respect to terminal voltage of one of the terminals of each of first coils 4u to 4w and neutral point N1. It is to be noted that each of the input voltages to first power converter 5 and second power converter 6 are equal. Thus, the total sum of the voltage level of neutral point N1 of first coils 4u to 4w and the voltage level of neutral point N2 of second coils 4u' to 4w' amount to Vin+ (=Vin+·3/3). As described above, common-mode noise can be reduced by preventing the variation in the voltage level between neutral points N1 and N2. The variation of neutral point voltage is not the only cause of common-mode noise. FIG. 4 is merely one example showing how noise can be suppressed.

Figure 5:
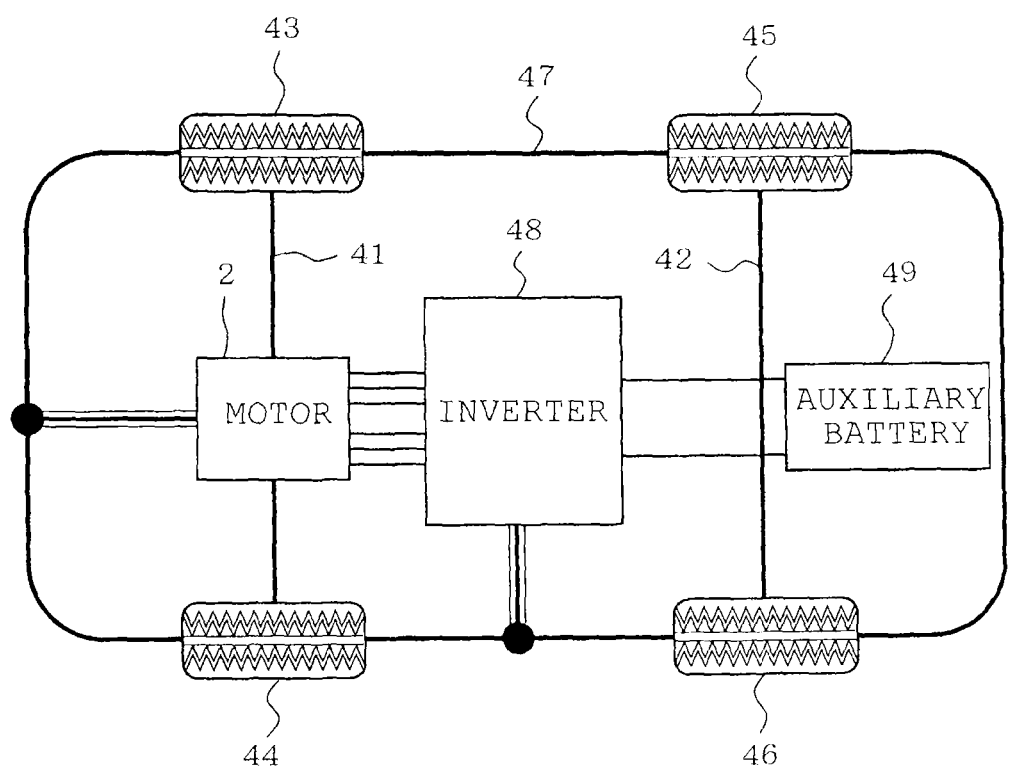
FIG. 5 illustrates one example of a system configuration in which the motor drive system is applied to an electric vehicle.
Figure 6:
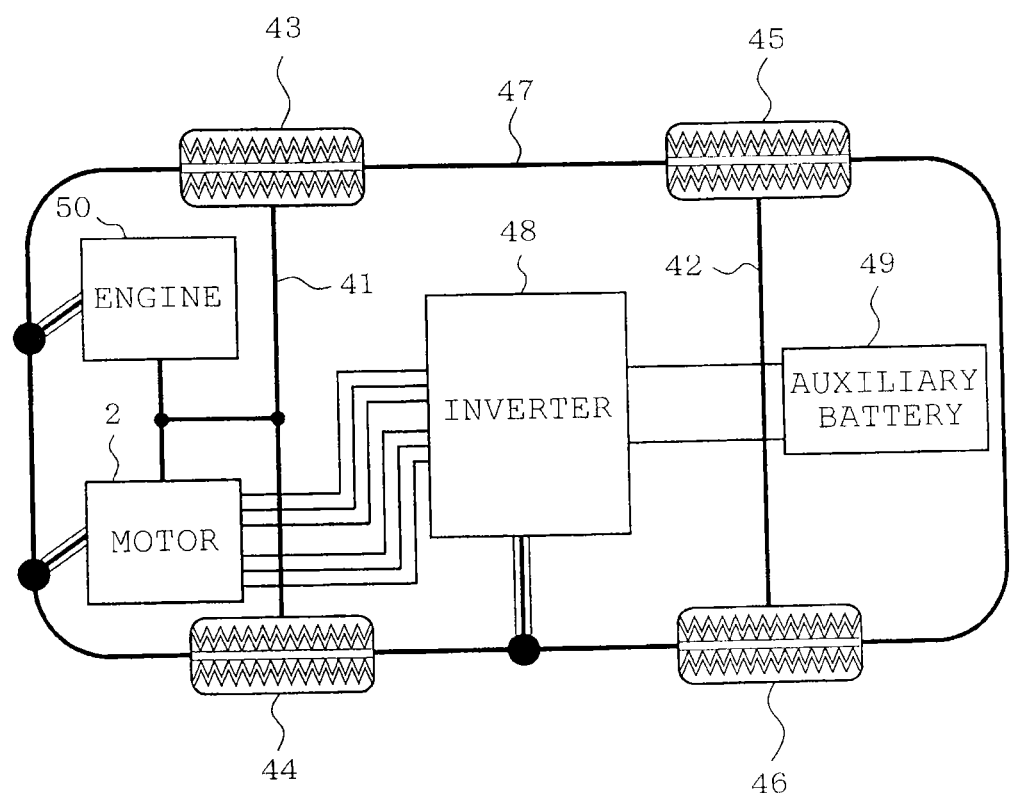
FIG. 6 corresponds to FIG. 5 and illustrates one example of a system configuration in which the motor drive system is applied to a hybrid vehicle.

FIGS. 5 and 6 are examples showing motor drive system 1 of the first embodiment implemented in an in-vehicle application. FIG. 5 illustrates an electric vehicle (EV) application. Wheels 43 to 46 are driven in rotation by motor 2 via components such as shafts 41 and 42. The housing of motor 2 is connected to chassis frame 47 (corresponding to a metal container-like member). Inverter 48 corresponds to drive unit 3 and its housing is electrically connected to chassis frame 47. Auxiliary battery 49 corresponds to DC power source 7. The housing of auxiliary battery 49 is not connected to chassis frame 47 in a high-voltage based system, but may be connected in a low-voltage system.

FIG. 6 illustrates a hybrid electric vehicle (HEV) application. A hybrid electric vehicle is one form of an electric vehicle. Wheels 43 to 46 are driven in rotation by motor 2 or engine 50 via components such as shafts 41 and 42. The housing of engine 50 is electrically connected to chassis frame 47. The electric connection between the housings of motor 2, inverter 48, and auxiliary battery 49 and chassis frame 47 is as described in the configuration of FIG. 5.

The operation performed before, during, and after simultaneous OFF period by the above described configuration will be described with reference to FIGS. 7 to 10. A "simultaneous OFF period" is a period in which both of the paired switching elements that constitute the main-half bridge circuit of a given phase are turned OFF. This is a period referred to as a "dead time" in a general half bridge circuit or inverter circuit. Because a sub-half bridge circuit is provided in the first embodiment as will be later described, the period in which both of the main-switching elements are turned OFF can no longer be described by the term "dead time" which carries the conventional meaning. Thus, the term "simultaneous OFF period" will be used instead.

In the first embodiment, controller 12 performs, during the simultaneous OFF period, a control to flow a freewheeling current through the main-freewheeling diode which is located on a side which is different from a side in which the main-switching element, being turned on after the simultaneous OFF period, is located. Further, controller 12 performs, during the later half of the simultaneous off period, a control to turn on the sub-switching element located in the same side as the main-switching element, being turned on after the simultaneous OFF period, is located.

In the first power converter 5 and second power converter 6, three-phase AC voltages of opposite polarities are applied to first coils 4u to 4w and second coils 4u' to 4w' and switching operations of opposite polarities are performed. This will be described through the operation of first power converter 5 pertaining to the U phase.

Figure 7:
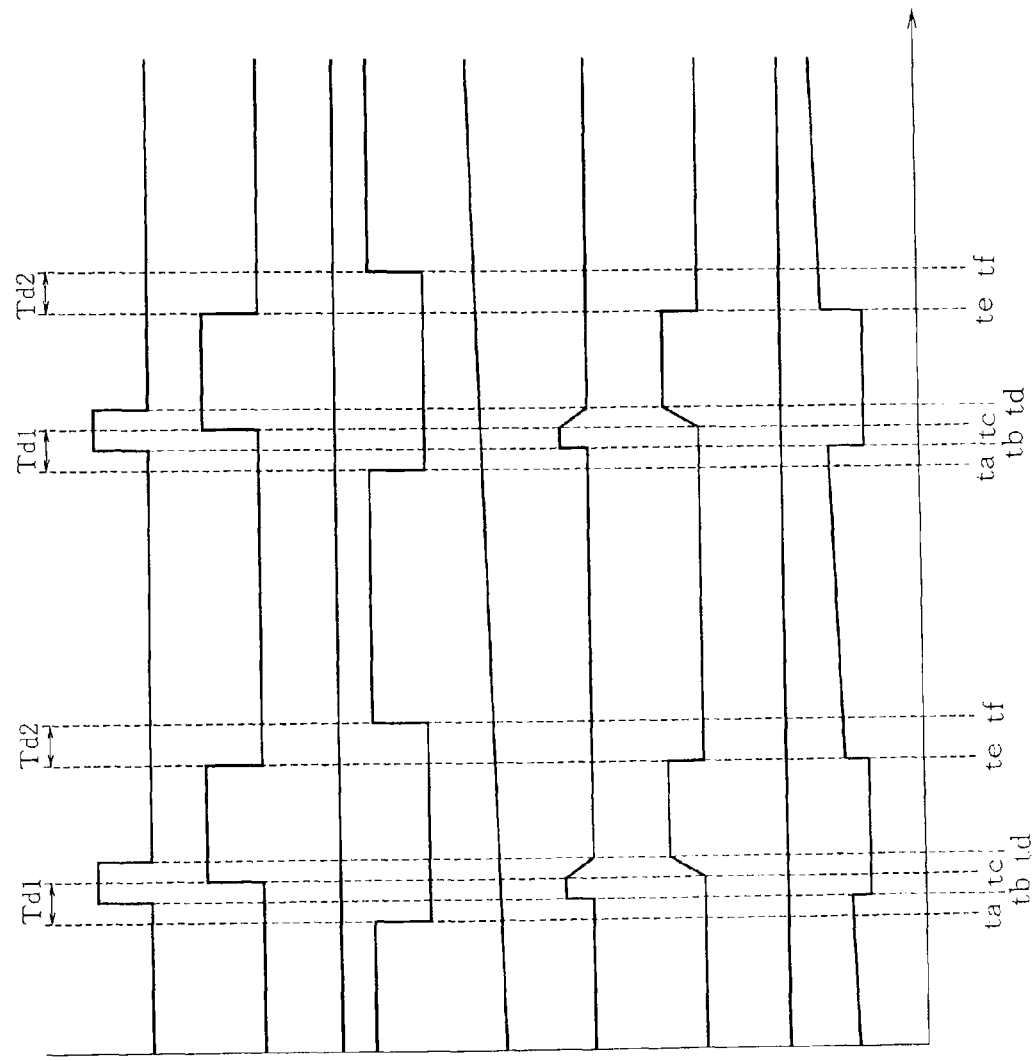
FIG. 7 is a timing chart indicating the drive signals and waveforms of current flowing through the components of the system when current flows from the drive unit side to the motor side.
Figure 8:
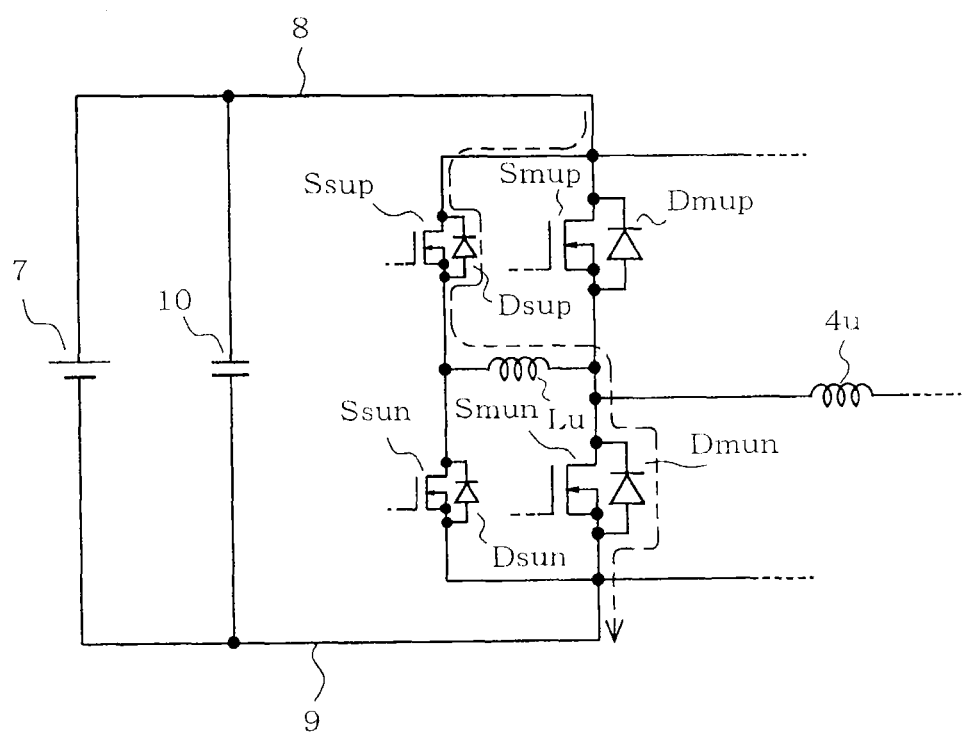
FIG. 8 illustrates a portion of the drive unit for energizing the U-phase coil.

In FIGS. 7 and 8, "a" to "d" represent drive signals Gsup, Gmup, Gsun, and Gmun, whereas "e" represents current Iu flowing through first coil 4u, "f" represents current Isup flowing through both or either one of the sub-switching element and sub-freewheeling diode in the upper arm side, "g" represents Imup flowing through both or either one of the main-switching element and main-freewheeling diode in the upper arm side, "h" represents current Isun flowing through both or either one of the sub-switching element and sub-freewheeling diode in the lower arm side, "i" represents Imun flowing through both or either one of the main-switching element and main-freewheeling diode in the lower arm side.

[1] When Current Flows from Drive Unit 3 Side Toward Motor 2 Side (Iu>0)

Period Td1 is a period from the moment when main-switching element Smun in the lower arm side of main-half bridge circuit 11u is turned OFF (time ta in FIG. 7) to the moment when main-switching element Smup of the upper arm side is turned ON (time tc in FIG. 7) and thus, is a simultaneous OFF period in which both main-switching elements Smup and Smun are turned OFF. The operations performed during, before and after period Td1 are as follows.

While main-switching element Smun is turned ON (period from time tf to time ta in FIG. 7), current Imun flows in the following route.
DC power source line 9→main-switching element Smun→first coil 4u
When main-switching element Smun is turned OFF (time to in FIG. 7), current Imun flows in the following route.
DC power source line 9→main-freewheeling diode Dmun→first coil 4u
At this instance, current Isun hardly flows in the following route (refer to "h" in FIG. 7).
DC power source line 9 sub-freewheeling diode Dsun→first coil 4u
This is because the size of sub-freewheeling diode Dsun is smaller than main-freewheeling diode Dmun and further because sub-inductor Lu exists in the above route.

Then, sub-switching element Ssup is turned ON at the moment (time tb in FIG. 7) preceding time tc on which main-switching element Smup is turned ON by a predetermined time span. This causes current Isup to flow in the following route indicated by broken line in FIG. 8.
DC power source line 8→sub-switching element Ssup→sub-inductor Lu→main-freewheeling diode Dmun→Dc source line 9
Current ISup is a current which short circuits DC power source lines 8 and 9; however, is inhibited from sudden increase by sub-inductor Lu and thus, does not flow excessively (see "f" of FIG. 7).

As described above, current ISup flowing in the reverse direction through main-freewheeling diode Dmun causes recovery (reverse recovery) of reverse blocking feature of main-freewheeling diode Dmun. At this instance, short-circuit current hardly flows in the following route.
DC power source line 8→sub-switching element Ssup→sub-freewheeling diode Dsun→Dc source line 9
This is because there is substantially no current flow through sub-freewheeling diode Dsun at or before time tb and thus, substantially no transport of remaining carrier occurs in sub-freewheeling diode Dsun, resulting in the reverse recovery time amounting to substantially zero.

Then, when main-switching element Smup is turned ON (at time tc of FIG. 7), current Imup starts to flow in the following route.

DC power source line 8→main-switching element Smup→first coil 4u

Current Isup flowing through sub-switching element Ssup is reduced as current Imup flowing through main-switching element Smup increases. Sub-switching element Ssup is turned OFF at the moment (time td in FIG. 7) succeeding time tc on which main-switching element Smup in the upper arm side is turned ON by a predetermined time span. As a result, current flowing through sub-switching element Ssup amounts to zero.

Period Td2 is a period from the moment when main-switching element Smup in the upper arm side of main-half bridge circuit 11u is turned OFF (time to in FIG. 7) to the moment when main-switching element Smun of the lower arm side is turned ON (time tf in FIG. 7) and thus, is a simultaneous OFF period in which both main-switching elements Smup and Smun are turned OFF. During, before and after period Td2, sub-switching elements Ssup and Ssun constituting sub-half bridge circuit 13u may be kept turned OFF. This means that the system may operate as in a conventional configuration which is not provided with sub-half bridge circuit for the following reasons.

During period Td2, current circulates through main-freewheeling diode Dmun parallel to the main-switching element Smun in the lower arm side being subsequently turned ON. Thus, there is no risk of short-circuit current originating from the recovery of main-freewheeling diode Dmun. Thus, no operation is required to suppress short-circuit current and the system may operate in a conventional manner.

[2] When Current Flows from Motor 2 Side to Drive Unit 3 Side (Iu<0)

Period Td1 is a period from the moment when main-switching element Smup in the upper arm side of main-half bridge circuit 11u is turned OFF (time to in FIG. 9) to the moment when main-switching element Smun of the lower arm side is turned ON (time tf in FIG. 9) and thus, is a simultaneous OFF period in which both main-switching elements Smup and Smun are turned OFF. The operations during, before and after period Td1 are as follows. While main-switching element Smup is turned ON (period from time tf to time ta in FIG. 9), current Imup flows in the following route.

first coil 4u→main-switching element Smup→DC power source line 8

When main-switching elements Smup is turned OFF (time ta in FIG. 9), current Imup flows in the following route.

first coil 4u→main-freewheeling diode Dmup→DC power source line 8

At this instance, current Isup hardly flows (refer to "f" in FIG. 9) in the following route.

first coil 4u→sub-freewheeling diode Dsup→DC power source line 8

This is because the size of sub-freewheeling diode Dsup is smaller than main-freewheeling diode Dmup and further because sub-inductor Lu exists in the above route.

Then, sub-switching element Ssun is turned ON at the moment (time tb in FIG. 9) preceding time tc on which main-switching element Smun is turned ON by a predetermined time span. This causes current Isun to flow in the following route indicated by broken line in FIG. 10.

DC power source line 8→main-freewheeling diode Dmup→sub-inductor Lu→sub-switching element Ssun→Dc source line 9

Figure 9:
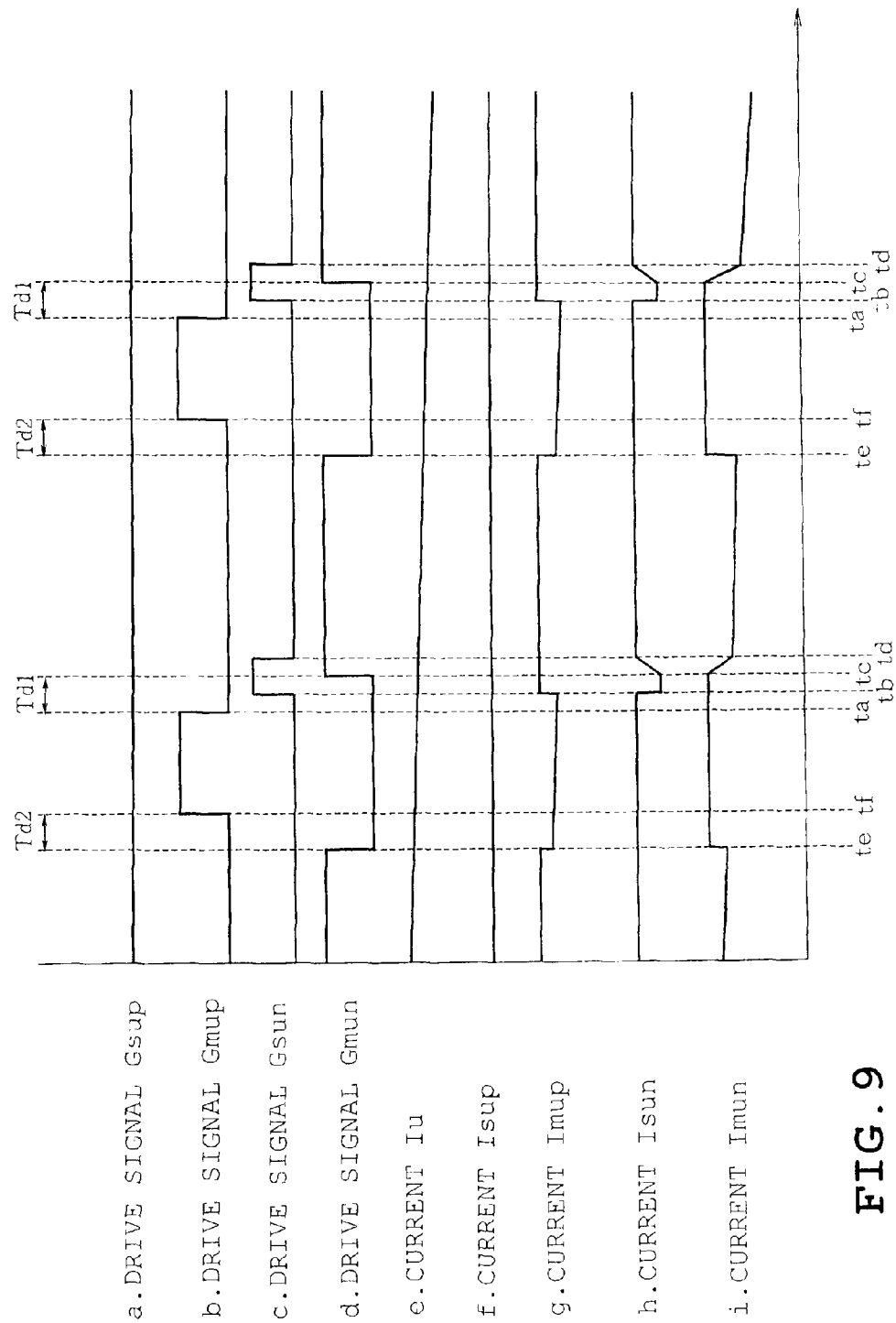
FIG. 9 corresponds to FIG. 7 and indicates the case in which current flows from the motor side to the drive unit side.
Figure 10:
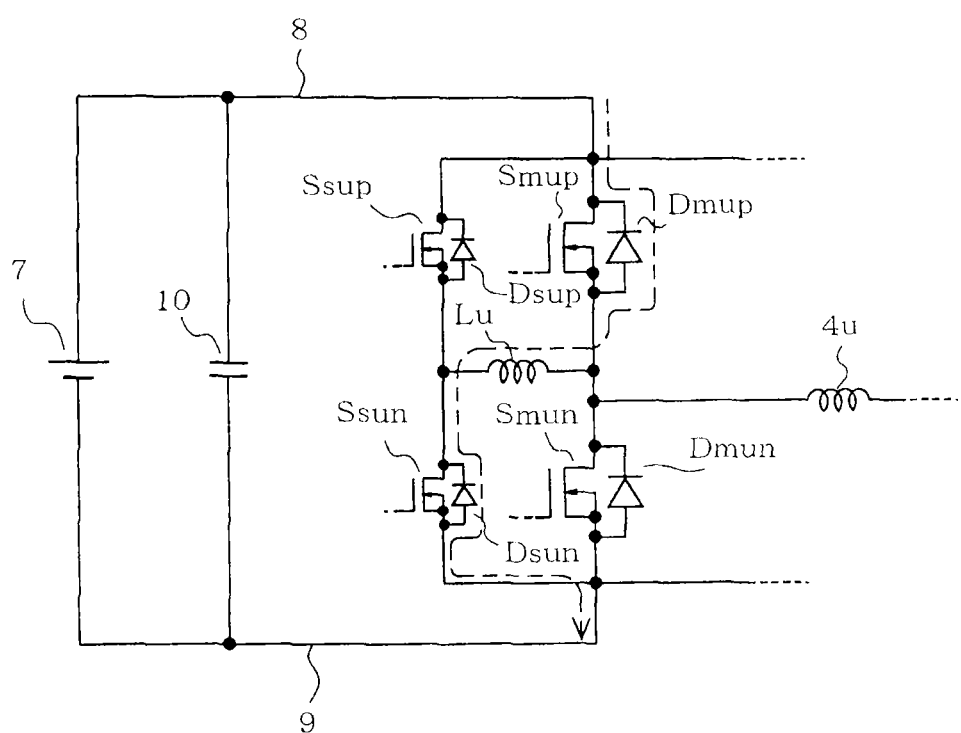
FIG. 10 corresponds to FIG. 8.
Figure 11:
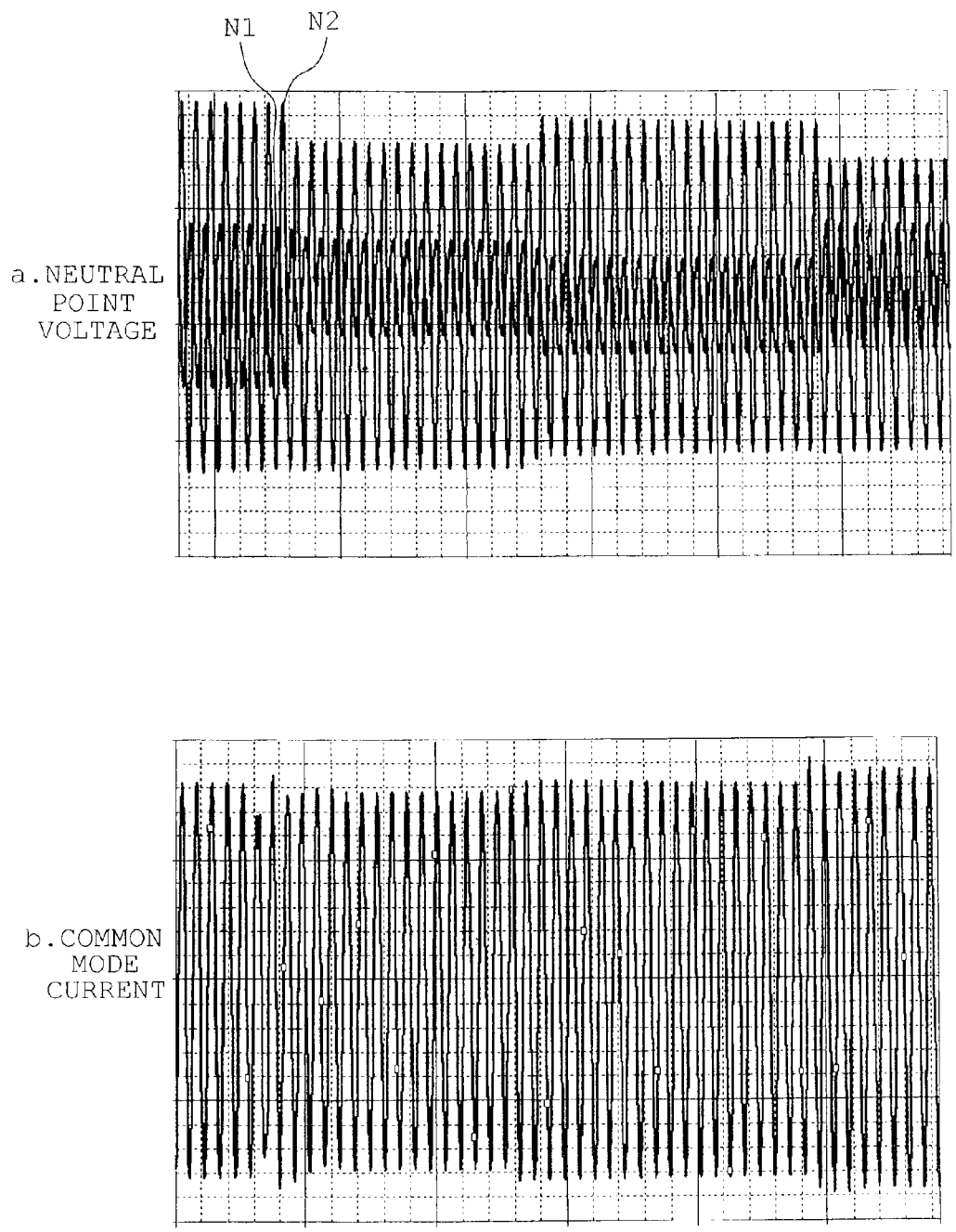
FIG. 11 indicates the neutral point voltage and common-mode voltage when no measures are taken to suppress short-circuit current.

Current ISun is a current which shorts circuits DC power source lines 8 and 9; however, is inhibited from sudden increase by sub-inductor Lu and thus does not flow excessively (see "h" of FIG. 9).

As described above, current ISun flowing in the reverse direction through main-freewheeling diode Dmup causes recovery (reverse recovery) of reverse blocking feature of main-freewheeling diode Dmup. At this instance, short-circuit current hardly flows in the following route.

DC power source line 8→sub-freewheeling diode Dsup→sub-switching element Ssun→Dc source line 9

This is because there is substantially no current flow through sub-freewheeling diode Dsup at or before time tb and thus, substantially no transport of remaining carrier occurs in sub-freewheeling diode Dsup, resulting in the reverse recovery time amounting to substantially zero.

Then, when main-switching element Smun is turned ON (at time tc of FIG. 9), current Imup starts to flow in the following route.

first coil 4u→main-switching element Smun→DC power source line 9

Current Isun flowing through sub-switching element Ssun is reduced as current Imun flowing through main-switching element Smun increases. Sub-switching element Ssun is turned OFF at the moment (time td in FIG. 9) succeeding time tc on which main-switching element Smun in the lower arm side is turned ON by a predetermined time span. As a result, current flowing through sub-switching element Ssun amounts to zero.

Period Td2 is a period from the moment when main-switching element Smun in the lower arm side of main-half bridge circuit 11u is turned OFF (time to in FIG. 9) to the moment when main-switching element Smup of the upper arm side is turned ON (time tf in FIG. 9) and thus, is a simultaneous OFF period in which both main-switching elements Smup and Smun are turned OFF. During, before and after period Td2, sub-switching elements Ssup and Ssun constituting sub-half bridge circuit 13u may be kept turned OFF. The reason is similar to the reason set forth in [1] as follows.

During period Td2, current circulates through main-freewheeling diode Dmup parallel to the main-switching element Smup in the upper arm side being subsequently turned ON. Thus, there is no risk of short circuiting current originating from the recovery of main-freewheeling diode during, before, and after period Td2 Dmup. Thus, no operation is required to suppress short circuit current.

The value of current energizing coil 4u of motor 2 via sub-switching element is equal to the value of current flowing via main-switching element. However, as shown in FIGS. 7 and 9, the duration of ON time of sub-switching element is shorter than the duration of ON time of main-switching element. Thus, sub-switching element may be smaller in size as compared to main-switching element.

The first embodiment described above provides the following advantages.

Because coils are wound on motor 2 rotor so that when first coils 4u to 4w and second coils 4u' to 4w' of stator 31 are energized by three-phase currents of opposite phase, rotor 21 rotates in a predetermined direction. Controller 12 controls the operations of first and second power converters 5 and 6 so that first coils 4u to 4w and second coils 4u' to 4w' are energized by sinusoidal currents of opposite phase.

The above described configuration produces voltage variation of opposite phase (positive and negative inversed) in neutral point N1 of first coils 4u to 4w and neutral point N2 of second coil 4u' to 4w'. Thus, in the common-mode currents originating from voltage variation in neutral points N1 and N2, the positive and the negative become inversed, and therefore the common-mode currents cancel one another. However, merely employing the above described configuration and performing the above described controls is unlikely to achieve the inversion of the positive and the negative in the voltages of neutral points N1 and N2 (see "a" of FIG. 11) due to the influence of high-frequency voltage variation of surge voltage originating from short-circuit current. In such case, the common-mode current cannot be sufficiently suppressed as can be seen in "b" of FIG. 11.

Thus, in the first embodiment, the generation of short-circuit current is prevented by controlling the drive of sub-switching elements Ssup to Sswn constituting sub-half bridge circuits 13u to 13w and sub-switching elements Ssup' to Sswn' constituting sub-half bridge circuits 15u to 15w in the above described manner during, before, and after the simultaneous OFF period. Further, because the occurrence of short-circuit current increases as the carrier frequency of the PWM control becomes higher and thus, short-circuit current can be suppressed more effectively.

Figure 12:
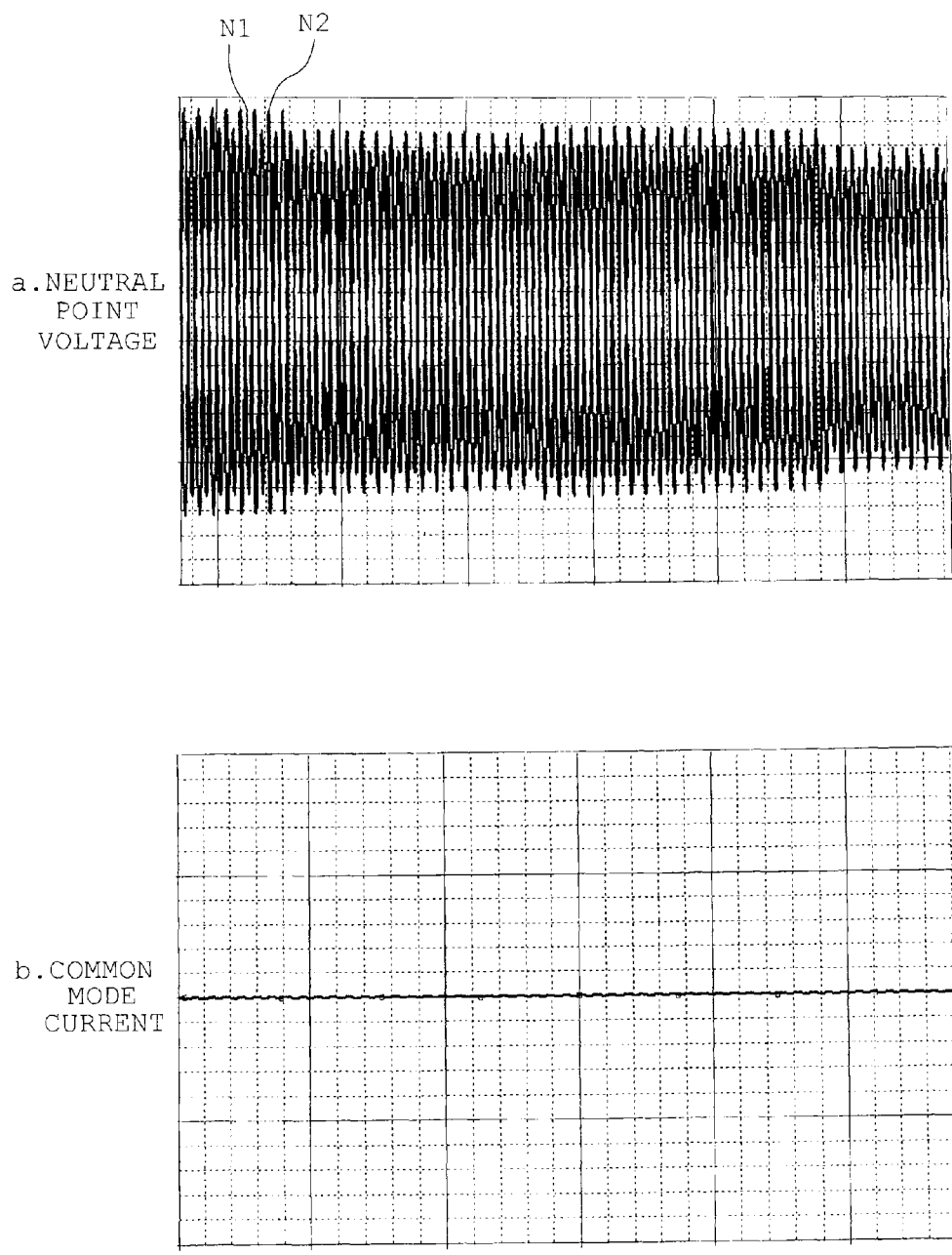
FIG. 12 corresponds to FIG. 11 and indicates a case when short-circuit current is suppressed.

Thus, as shown in "a" of FIG. 12, voltage variation in which the positive and the negative are inversed is ensured at neutral points N1 and N2. Hence, in the first embodiment, the common-mode current originating from voltage variation is ensured to cancel one another by the inversion of the positive and the negative as shown "b" of FIG. 12. As a result the first embodiment improves the reliability in suppressing common-mode noise.

When motor drive system 1 is employed in electric vehicles such as EV and HEV, the housing of motor 2 is electrically connected to chassis frame 47. Thus, common-mode noise becomes increasingly prominent when common-mode current is not addressed sufficiently. Motor drive system 1 of the first embodiment is especially advantageous in such in-vehicle applications or in applications where motor 2 is disposed within a metal container-like member.

Energy being accumulated in sub-inductors Lu to Lw and Lu' to Lw' while sub-switching elements Ssup to Sswn and Ssup' to Sswn' are turned ON (for example, during time tb to td in FIG. 7 and time tb to td in FIG. 9) is outputted to loads such as motor 2 while sub-switching elements Ssup to Sswn and Ssup' to Sswn' are turned OFF and used as electric power. Thus, degradation in efficiency originating from the operations performed in sub-half bride circuits 13u to 13w and 15u to 15w for suppressing short-circuit current can be minimized.

Further, the inductance values of sub-inductors Lu to Lw and Lu' to Lw' have been specified so that the time constant of sub-inductors Lu to Lw and Lu' to Lw' become smaller than the PWM period. As a result, sub-inductors Lu to Lw and Lu' to Lw' are energized by zero current when main-switching elements Ssup to Sswn and Ssup' to Sswn' are switched between the ON/OFF states, thereby achieving reduction in short-circuit current.

Second Embodiment

FIGS. 14 to 17 illustrate a second embodiment. The elements that are identical to those of the first embodiment are identified by identical reference symbols and are not re-described. The following description will focus on the differences from the first embodiment. Drive unit 51 constituting transformer drive system 50 of the second embodiment is provided with third power converter 52 in addition to first and second power converters 5 and 6. Third power converter 52 is a DC-DC converter and is provided with main-half bridge circuit 53 and sub-half bridge circuit 54 connected between DC power source lines 8 and 9.

Main-half bridge circuit 53 comprises a series circuit configured by main-switching elements Smxp and Smxn. Sub-half bridge circuit 54 comprises a series circuit configured by sub-switching elements Ssxp and Ssxn. Main-switching elements Smxp and Smxn establish an inverse-parallel connection with main-freewheeling diodes Dmxp and Dmxn, respectively. Sub-switching elements Ssxp and Ssxn establish an inverse-parallel connection with sub-freewheeling diodes Dsxp and Dsxn, respectively.

Further, reactor (main inductor) 55 is connected between DC power source 7 and the midpoint of main-switching elements Smxp and Smxn. Sub-inductor Lx is connected between the aforementioned midpoint and the midpoint of sub-switching elements Ssxp and Ssxn. Reactor 55 is wound on iron core 56.

The ON/OFF control of main-switching elements Smxp and Smxn and the ON/OFF control of sub-switching elements Ssxp and Ssxn are performed by drive signals Gmxp, Gmxn, Gsxp, and Gsxn outputted by controller 57. Third power converter 52 is configured as described above. Third power converter 52 transforms the inputted voltage of DC power source 7 by the execution of a PWM control of main-switching elements Smxp and Smxn of main-half bridge circuit 53 while referencing output voltage (though not shown). Drive unit 51 controls three-phase transformer 58 (electromagnetic appliance) instead of motor 2.

Three-phase transformer 58 is provided with a pair of three phase (n=3) coils namely, first coils 59u, 59v, and 59w and second coils 59u', 59v', and 59w'. Coils 59u and 59u' are wound in the opposite directions on U-phase iron core 60U. Similarly, coils 59v and 59v' and coils 59w and 59w' are wound on V-phase iron core 60 and W-phase iron core 60, respectively.

The secondary side of three-phase transformer 58 is connected, for example, to the three-phase commercial AC source line. For instance, when DC power source 7 is a solar cell or rechargeable battery, or the like, voltages of DC power supplied from them are transformed by third power converter 52 and converted into AC power having a frequency matching the frequency of commercial AC source by first and second power converters 5 and 6. The AC power is further subjected to voltage transformation by three-phase transformer 58 and supplied to commercial AC source line.

Figure 15:
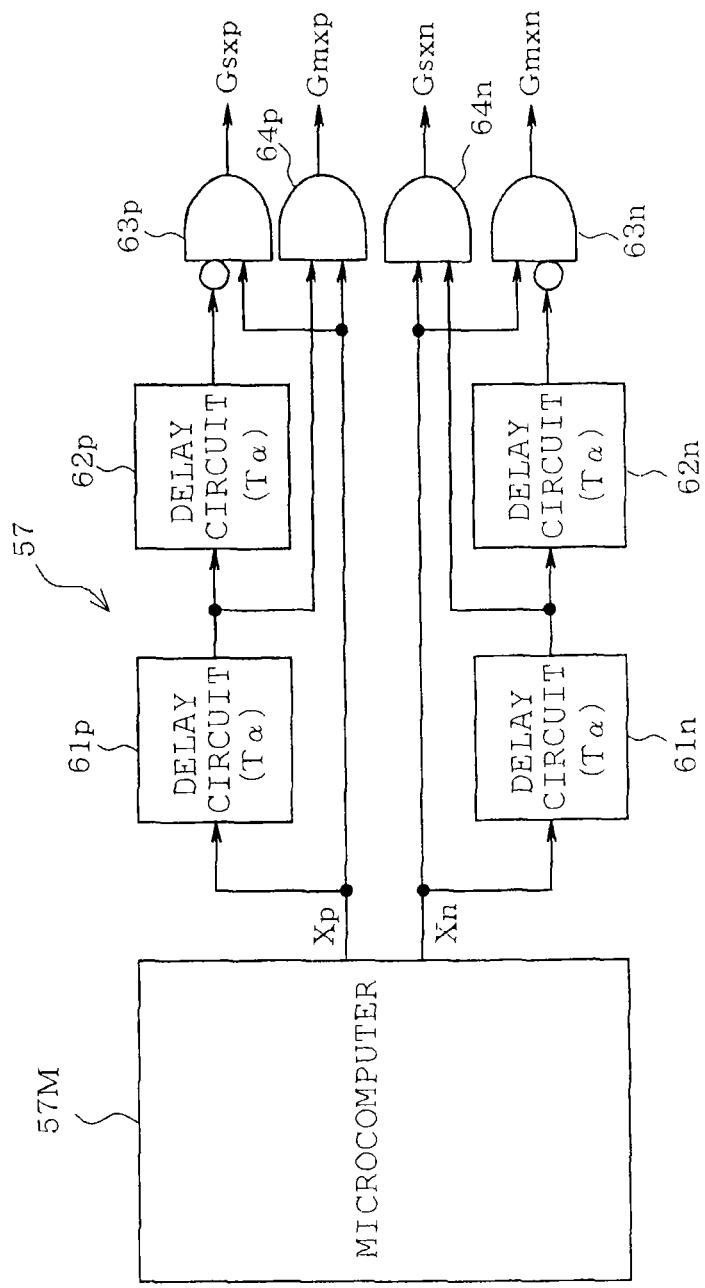
FIG. 15 indicates one example of a logic for producing drive signals Gmxp, Gmxn, Gsxp, and Gsxn based on control signals Xp and Xn.

FIG. 15 illustrates one example of a logic for producing drive signals Gmxp, Gmxn, Gsxp, and Gsxn based on control signals Xp and Xn outputted by microcomputer 57M. Microcomputer 57M is a component of controller 57. The logic comprises four delay circuits 61p, 61n, 62p, and 62n and four AND gates 63p, 63n, 64p, and 64n. The positive side and the negative side are arranged to be symmetrical. The control signal Xp is given to one of input terminals of both AND gates 63p and 64p while also being given to the remaining other input terminal of AND gate 64p via delay circuit 61p.

Further control circuit Xp is given to negative logic input terminal of AND gate 63p via delay circuit 62p series connected to delay circuit 61p. Delivery of control circuit Xn is arranged in a similar manner except that suffixes of delay circuits 61 and 62 and AND gates 63 and 64 are to be replaced by "n". The time of delay added by delay circuit 61 and 62 are both "Tα".

Figure 16:
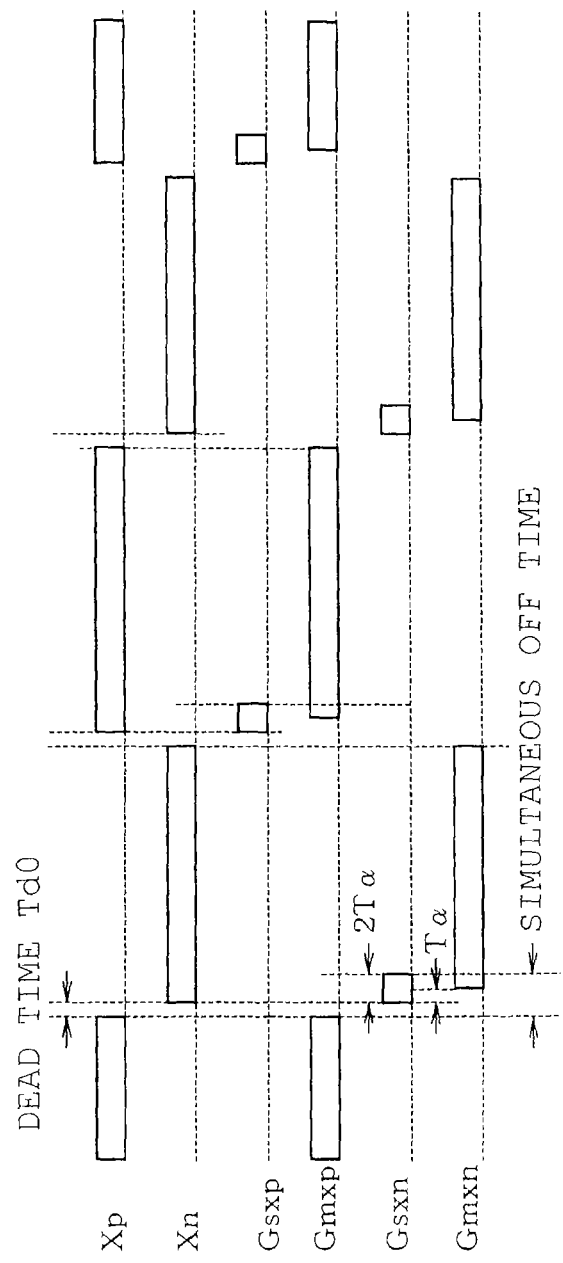
FIG. 16 corresponds to FIG. 7.

Next, the operation of the second embodiment will be described with reference to FIG. 16. The control of three-phase transformer 58 by first and second power converters 5 and 6 are similar to the control described in the first embodiment and thus, a description will be given only on the control of third power converter 52 performed by controller 57. Microcomputer 57M alternately modifies control signals Xp and Xn to high level with dead time Td0 provided between the signal modifications.

For instance, drive signal Gsxn which is an output signal of AND gate 63n is modified to high level substantially in synch with the rise of control signal Xn. Then, after lapse of delay time Tα, drive signal Gmxn which is an output signal of AND gate 64n is modified to high level. After further lapse of delay time Tα, drive signal Gsxn which is an output signal of AND gate 63n is modified to low level.

The period referred to as "simultaneous OFF period" in the first embodiment spans from the rise of control signal Xp to the moment when drive signal Gxmn is modified to high level (Td0+Tα). In the second embodiment, sub-half bridge circuit 54 is provided so as to be associated with main-half bridge circuit 53. There is a period in which sub-switching elements Ssxp and Ssxn are turned ON during simultaneous OFF period and during such period, a small short-circuit current is generated. Thus, in the second embodiment, the conventional dead time corresponds to the period in which control signals Xp and Xn are modified simultaneously to low level by microcomputer 57.

Each of the signal patterns indicated in FIGS. 7 and 9 described in the first embodiment can be similarly produced by the logic indicated in FIG. 15. For instance, the microcomputer within controller 12 may produce an output so that control signals Up and Ux pertaining to the U phase are alternately modified to high level with a dead time provided between the signal modifications.

Figure 17:
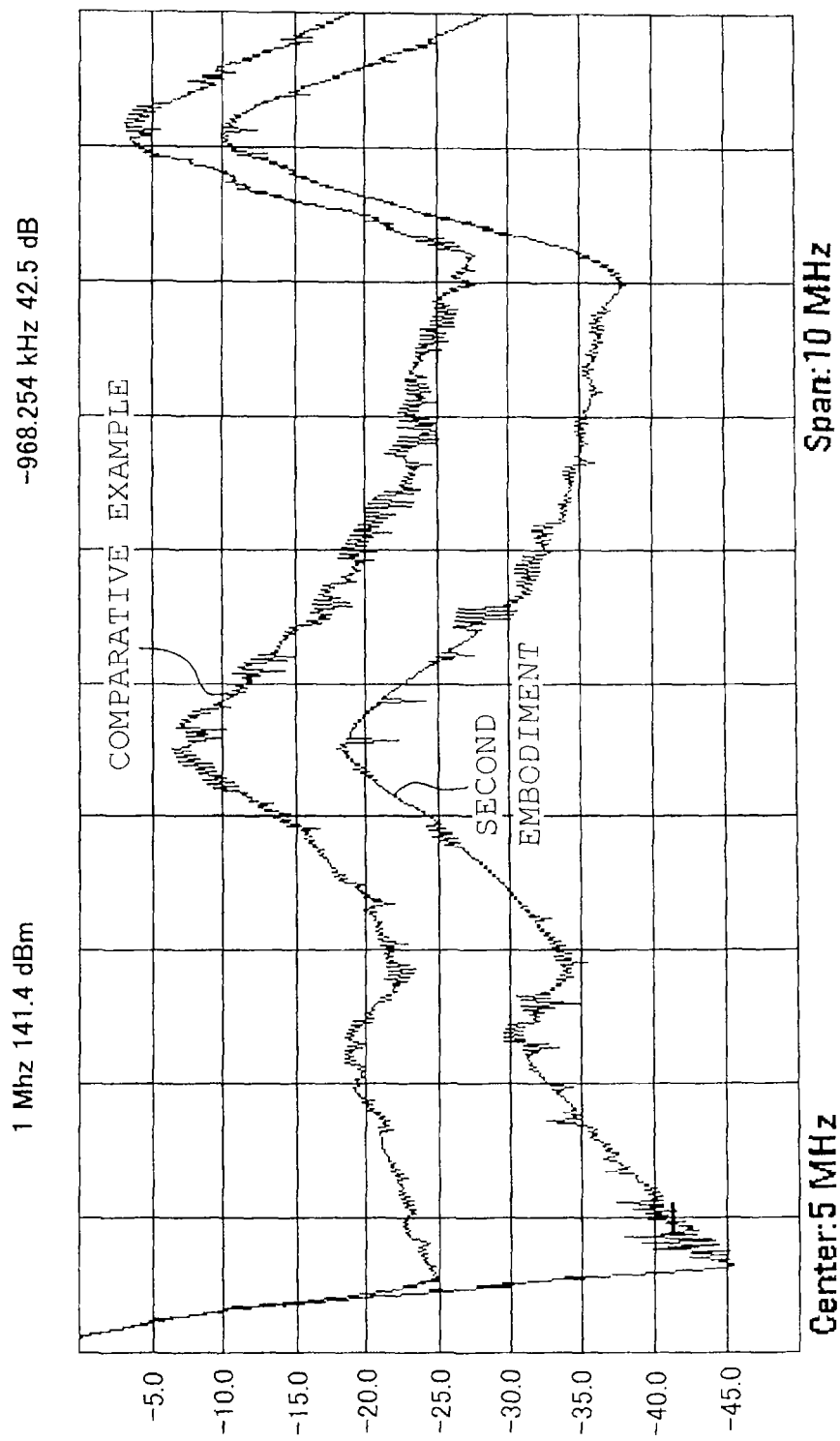
FIG. 17 indicates a waveform obtained by measuring the voltage levels between neutral points N1 and N2.

FIG. 17 is a waveform representing the measurement of common-mode voltage occurring between neutral points N1 and N2 of three-phase transformer 58. The use of transformer drive system 50 of the second embodiment has reduced the noise level by approximately 10 dB (approximately 1/10) of the conventional configuration in which a three-phase transformer is driven by a three-phase inverter (Waveforms shown in FIGS. 11 and 12 of the first embodiment are simulated results).

In the second embodiment, three-phase transformer 58 is driven by first and second power converters 5 and 6 as was the case in the first embodiment and DC power source to be inputted to these components are supplied through third power converter 52 serving as a DC-DC converter. Third power converter 52 is configured by main-half bridge circuit 53 and sub-half bridge circuit 54 in parallel connection with one another between DC power source lines 8 and 9, reactor 55 connected between DC power source 7 and the midpoint of main-half bridge circuit 53, sub-inductor Lx connected between the midpoints of main-half bridge circuit 53 and sub-half bridge circuit 54, and controller 57 that executes PWM control of the ON/OFF operations of the main switching elements.

Main-half bridge circuit 53 is provided with a pair of switching elements Sxmp and Sxmn and main-freewheeling diodes Dxmp and Dxmn. Sub-half bridge circuit 54 is provided with a pair of sub-switching elements Sxsp and Ssxn. Controller 57 performs, during a simultaneous OFF period in which both main-switching elements Sxmp and Sxmn are turned OFF, a control to provide a period in which freewheeling current flows through freewheeling diode Dxm which is located on a side different from a side in which main-switching element Sxm, being turned ON after the simultaneous OFF period is terminated, is located. During such period, controller 57 further performs a control to turn ON sub-switching element Sxs located in the same side as the main-switching element Sxm. Thus, short-circuit current can be suppressed in operating the DC-DC converter as well.

Other Embodiments

The foregoing embodiments are merely examples and are not to be construed to limit the present application in any way. The foregoing embodiments may be implemented in various other forms and may be modified within the spirit of the application.

Switching element is not limited to a power MOSFET but may be replaced by various other self-turn-off semiconductor switching elements such as a bipolar transistor and IGBT (Insulated Gate Bipolar Transistor). Unipolar element, such as SiC (silicon carbide) and GaN (gallium nitride), which is a high-speed switching element under recent development exhibits stabilized switching properties and high dependency rate to gate signals and thus, is effective in implementing noise cancellation by reverse-phase switching controls such as those described in the embodiments.

The start point of the ON operation for sub-switching elements Ssup to Sswn and Ssup' to Sswn' being turned ON after the simultaneous OFF period is not limited to the timings indicated in FIGS. 7 and 9 but may be turned ON at any timing preceding the ON operation of main-switching elements Smup to Smwn and Smup' to Smwn' being turned ON after the simultaneous OFF period is terminated.

Further, the start point of OFF operation for sub-switching elements Ssup to Sswn and Ssup' to Sswn' being turned ON in the later half of the simultaneous OFF period is not limited to the timings indicated in FIGS. 7 and 9 but may be modified as required. For instance, the OFF operation may be started immediately after the ON operation of main-switching elements Smup to Smwn and Smup' to Smwn' which are turned ON after the simultaneous OFF period is terminated. However, the duration of ON time of sub-switching elements Ssup to Sswn and Ssup' to Sswn' is preferably made as short as possible in order to reduce power consumption and to accelerate PWM control.

The corresponding sub-switching element may be turned ON in the later half of the simultaneous OFF period (for example in period Td2 of FIGS. 7 and 9) in which current is circulated through the main-freewheeling diode in the same side as the main-switching element being turned ON after the simultaneous OFF period is terminated. Such configuration allows the control to be simplified since controller 12 need not switch the controls of the sub-switching element in the later half of the simultaneous OFF period depending upon the state of circulation of current.

The control for energizing first coils 4u to 4w and second coils 4u' to 4w' with a sinusoidal current is not limited to a PWM control but may employ other control schemes such as a rectangular wave control.

Motor drive system 1 is not limited to electric vehicle applications such as EV and HEV but may be used in motor driven vehicles in general such as trains. Motor drive system 1 may be used in various other types of applications such as home electronics, office automation equipments, and industrial machinery. In applications in which motor 2 is disposed inside a metal container-like member, the advantages of common-mode noise reduction can be obtained more effectively.

Motor 2 is not limited to an outer-rotor type but may be configured, for example, as an inner-rotor type.

The number of phases of motor 2 may be two or any other number of phases. In such case, drive unit 3 may be modified to comprise a first power converter and a second converter that transform DC current into an alternating current having n (n is an integer equal to or greater than 2) number of phases and motor 2 may be modified to be provided with first coils for n number of phases and a second coil for n number of phases.

Figure 3:
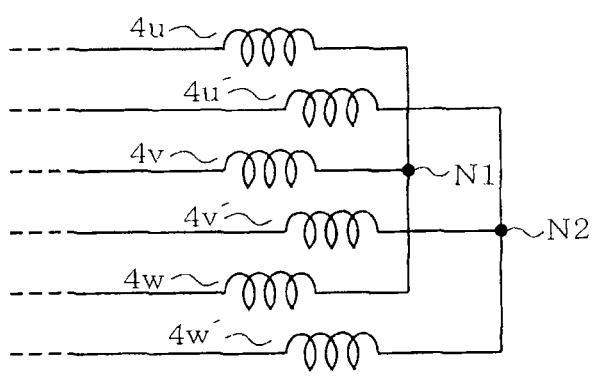
FIG. 3 schematically illustrates the connection of the stator coils.
Figure 13:
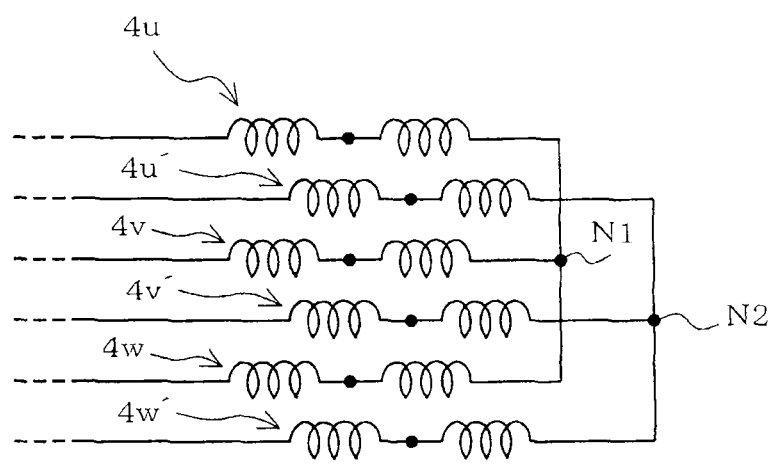
FIG. 13 is a modified example of FIG. 3.
Figure 14:
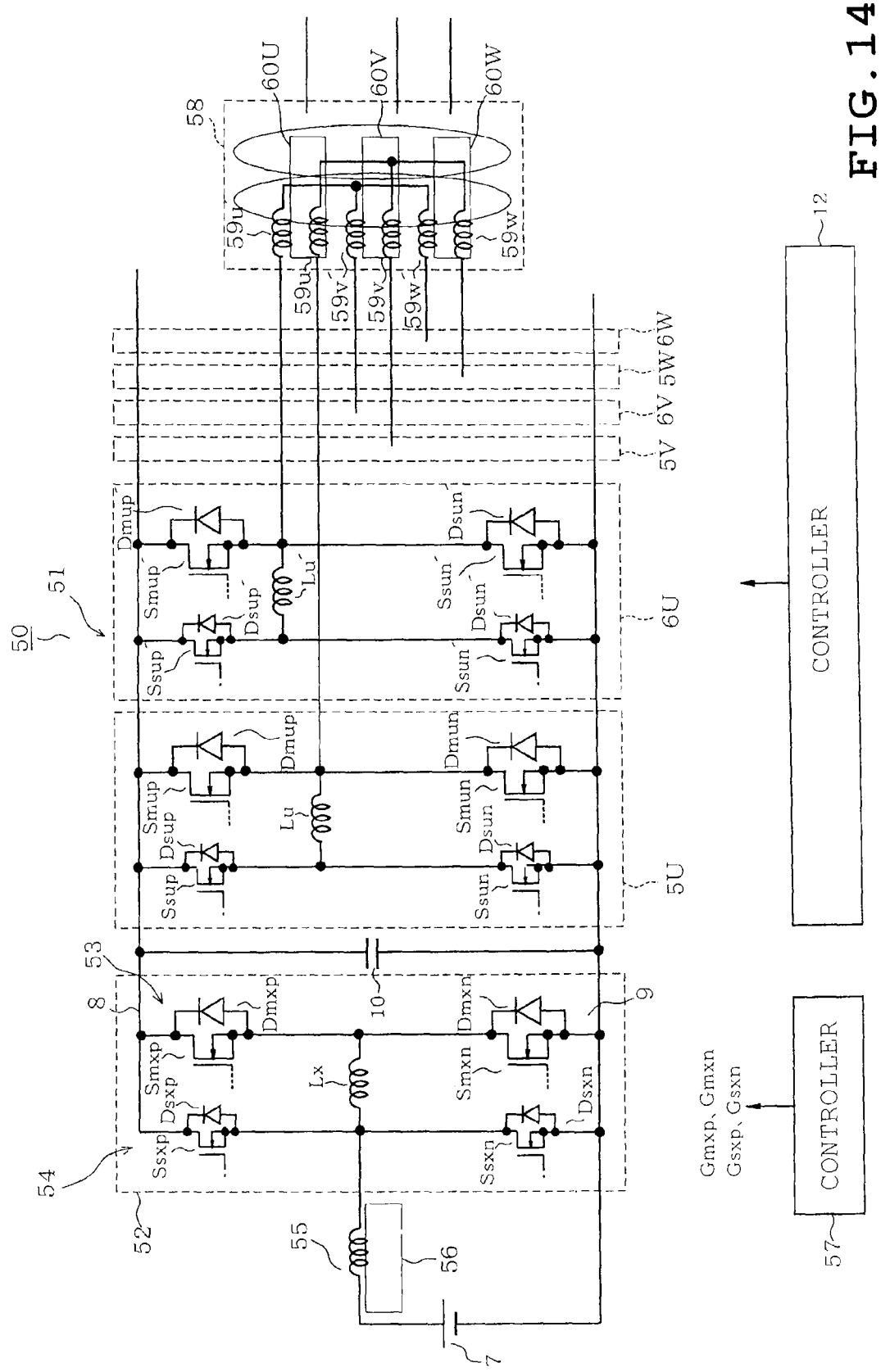
FIG. 14 illustrates a second embodiment and corresponds to FIG. 1.

The winding of coils on motor 2 is not limited to the arrangement shown in FIGS. 2 and 3 but may be modified as required as long as the rotor can be rotated in a predetermined direction by energizing the pair of n-phase (n is an integer equal to or greater than 2) stator coils with currents being opposite in phase with one another. For instance as shown in FIG. 13, each of first coils 4u to 4w and second coils 4u' to 4w' may be configured by 2 coils. In such case, stator core having 12 teeth is used and the coils are wound on the corresponding teeth. The number of coils may be three or more.

In the foregoing embodiments, coils of motor 2 are wound by concentrated winding, however, other winding methods such as a shunt winding may be employed instead.

In the second embodiment, controllers 12 and 57 may be replaced by a single controller.

Further, in the second embodiment, third power converter 52 and controller 57 may be provided as required.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A system for driving an electromagnetic appliance comprising:
    an electromagnetic appliance; and
    a drive unit driving the electromagnetic appliance, the drive unit including a first power converter converting a direct current voltage inputted from a pair of direct current power source lines into an n-phase alternating current voltage, where n is a positive integer equal to or greater than 2, a second power converter converting the direct current voltage into an n-phase alternating current voltage, and a controller controlling operations of the first and the second power converters;
    wherein the first and the second power converters each includes a main-half bridge circuit for each of the n phases and a sub-half bridge circuit for each of the n phases being in parallel connection with one another between the pair of direct current power source lines, an n number of sub-inductors disposed between a midpoint of the main-half bridge circuit for each of the n phases and a mid point of the sub-half bridge circuit for each of the n phases, each of the main-half bridge circuits including a pair of main-switching elements, a main-freewheeling diode in an inverse-parallel connection with each of the main-switching elements, and each of the sub-half bridge circuits including a pair of sub-switching elements, and
    wherein the electromagnetic appliance includes a first coil and a second coil for each of the n phases being connected to a midpoint of the main-half bridge circuit for each of the n phases provided in the first and the second power converters, and an iron core on which both the first and the second coils for each of the n phases are wound, the electromagnetic appliance being configured to excite the iron core in a predetermined direction by energizing the first and the second coils for each of the n phases with n-phase currents being opposite in phase from one another, and
    wherein the controller is configured to control the first and the second power converters so that the n-phase alternating current voltage is applied to the first and the second coils for each of the n phases, and is further configured so that both of the pair of main-switching elements of each of the n phases are turned off during a simultaneous off period, the simultaneous off period including a first period in which a freewheeling current flows through a main-freewheeling diode of a given phase located at a different position than a main-switching element of said given phase being turned on after the simultaneous off period, and a sub-switching element of said given phase turned on during the first period.

2. The system according to claim 1, wherein the controller is configured to control on/off operation of the main switching elements by a PWM control and wherein an inductance value of each sub-inductor is specified so that a time constant including the sub-inductor is smaller than a period of the PWM control.

3. The system according to claim 2, wherein the controller turns off the sub-switching element turned on during the simultaneous off period immediately after a corresponding main-switching element located in the second side is turned on after the simultaneous off period.

4. The system according to claim 3, further comprising a direct current power source and a DC-DC converter connected between the first and the second power converters, wherein the DC-DC converter includes:
    a main-half bridge circuit and a sub-half bridge circuit in parallel connection with one another between the pair of direct power source lines;
    a main-inductor disposed between the direct current power source and a midpoint of the main half bridge circuit;
    a sub-inductor disposed between midpoints of the main-half bridge circuit and the sub-half bridge circuit; and
    a controller configured to control on/off operations of the main-switching elements and the sub-switching elements by PWM control;
    wherein the main-half bridge circuit includes a pair of main-switching elements and a freewheeling diode in an inverse-parallel connection with each of the main-switching elements and the sub-half bridge circuit includes a pair of sub-switching elements; and
    wherein the controller performs a control so that both of the pair of main-switching elements of are turned off during a simultaneous off period, the simultaneous off period including a first period in which a freewheeling current flows through a freewheeling diode located in a first side different from a second side in which a main-switching element being turned on after the simultaneous off period is located, and a sub-switching element located in the second side is turned on during the first period.

5. The system according to claim 2, further comprising a direct current power source and a DC-DC converter connected between the first and the second power converters, wherein the DC-DC converter includes:
    a main-half bridge circuit and a sub-half bridge circuit in parallel connection with one another between the pair of direct power source lines;
    a main-inductor disposed between the direct current power source and a midpoint of the main half bridge circuit;
    a sub-inductor disposed between midpoints of the main-half bridge circuit and the sub-half bridge circuit; and a controller configured to control on/off operations of the main-switching elements and the sub-switching elements by PWM control;

wherein the main-half bridge circuit includes a pair of main-switching elements and a freewheeling diode in an inverse-parallel connection with each of the main-switching elements and the sub-half bridge circuit includes a pair of sub-switching elements; and wherein the controller performs a control so that both of the pair of main-switching elements are turned off during a simultaneous off period, the simultaneous off period including a first period in which a freewheeling current flows through a freewheeling diode located in a first side different from a second side in which a main-switching element being turned on after the simultaneous off period is located, and a sub-switching element located in the second side is turned on during the first period.

6. The system according to claim 1, wherein the controller turns off the sub-switching element turned on during the simultaneous off period immediately after a corresponding main-switching element located in the second side is turned on after the simultaneous off period.

7. The system according to claim 6, further comprising a direct current power source and a DC-DC converter connected between the first and the second power converters, wherein the DC-DC converter includes:

a main-half bridge circuit and a sub-half bridge circuit in parallel connection with one another between the pair of direct power source lines;

a main-inductor disposed between the direct current power source and a midpoint of the main half bridge circuit;

a sub-inductor disposed between midpoints of the main-half bridge circuit and the sub-half bridge circuit; and a controller configured to control on/off operations of the main-switching elements and the sub-switching elements by PWM control;

wherein the main-half bridge circuit includes a pair of main-switching elements and a freewheeling diode in an inverse-parallel connection with each of the main-switching elements and the sub-half bridge circuit includes a pair of sub-switching elements; and wherein the controller performs a control so that both of the pair of main-switching elements are turned off during a simultaneous off period, the simultaneous off period including a first period in which a freewheeling current flows through a freewheeling diode located in a first side different from a second side in which a main-switching element being turned on after the simultaneous off period is located, and a sub-switching element located in the second side is turned on during the first period.

8. The system according to claim 1, further comprising a direct current power source and a DC-DC converter connected between the first and the second power converters, wherein the DC-DC converter includes:

a main-half bridge circuit and a sub-half bridge circuit in parallel connection with one another between the pair of direct power source lines;

a main-inductor disposed between the direct current power source and a midpoint of the main-half bridge circuit;

a sub-inductor disposed between midpoints of the main-half bridge circuit and the sub-half bridge circuit; and a controller configured to control on/off operations of the main-switching elements and the sub-switching elements by a PWM control;

wherein the main-half bridge circuit includes a pair of main-switching elements and a freewheeling diode in an inverse-parallel connection with each of the main-switching elements and the sub-half bridge circuit includes a pair of sub-switching elements; and wherein the controller performs a control so that both of the pair of main-switching elements are turned off during a simultaneous off period, the simultaneous off period including a first period in which a freewheeling current flows through a freewheeling diode located in a first side different from a second side in which a main-switching element being turned on after the simultaneous off period is located, and a sub-switching element located in the second side is turned on during the first period.

9. The system according to claim 1, wherein the electromagnetic appliance comprises a motor.

10. The system according to claim 9, wherein the motor is disposed inside a metal container-like member.

11. A motor drive vehicle comprising:

a motor including coils of n number of phases where n is a positive integer equal to or greater than 2, the coils of each of the n phases being arranged in a pair and being wound so as to be excited in a predetermined direction by being energized with opposite-phase currents;

wheels driven by the motor;

a drive unit driving the motor, the drive unit including a first power converter converting a direct current voltage inputted from a pair of direct current power source lines into an n-phase alternating current voltage, where n is a positive integer equal to or greater than 2, a second power converter converting the direct current voltage into n-phase alternating current voltage, and a controller controlling operations of the first and the second power converters;

wherein the first and the second power converters each includes main-half bridge circuits for each of the n phases, sub-half bridge circuits for each of the n phases, and n number of sub-inductors disposed between a midpoint of the main-half bridge circuit and a midpoint of the sub-half bridge circuit for each of the n phases, each of the main-half bridge circuits including a pair of main-switching elements, a main-freewheeling diode in an inverse-parallel connection with each of the main-switching elements, and each of the sub-half bridge circuits including a pair of sub-switching elements, and wherein the motor includes a first coil and a second coil for each of the n phases being connected to a midpoint of the main-half bridge circuit for each of the n phases, and an iron core on which both the first and the second coils are wound, the motor being configured to excite the iron core in a predetermined direction by energizing the first and the second coils for each of the n phases with n-phase currents being opposite in phase from one another, and wherein the controller is configured to control the first and the second power converters so that the n-phase alternating current voltage is applied to the first and the second coils for each of the n phases, and configured so that both of the pair of main-switching elements are turned off during a simultaneous off period, the simultaneous off period including a first period in which a freewheeling current flows through a main-freewheeling diode of a given phase located at a different position than a main-switching element of same given phase being turned on after the simultaneous off period, and a sub-switching element of same given phase turned on during the first period.

12. The motor drive vehicle according to claim 11, wherein the motor is disposed inside metal container-like member.

* * * * *